(12) United States Patent
Mochida

(10) Patent No.: US 11,545,812 B2
(45) Date of Patent: Jan. 3, 2023

(54) SEMICONDUCTOR LASER ELEMENT

(71) Applicant: PANASONIC CORPORATION, Osaka (JP)

(72) Inventor: Atsunori Mochida, Osaka (JP)

(73) Assignee: PANASONIC HOLDINGS CORPORATION, Osaka (JP)

( * ) Notice: Subject to any disclaimer, the term of this patent is extended or adjusted under 35 U.S.C. 154(b) by 251 days.

(21) Appl. No.: 16/646,977

(22) PCT Filed: Aug. 9, 2018

(86) PCT No.: PCT/JP2018/029858
§ 371 (c)(1),
(2) Date: Mar. 12, 2020

(87) PCT Pub. No.: WO2019/058802
PCT Pub. Date: Mar. 28, 2019

(65) Prior Publication Data
US 2020/0212655 A1 Jul. 2, 2020

(30) Foreign Application Priority Data
Sep. 20, 2017 (JP) .............................. JP2017-180002

(51) Int. Cl.
*H01S 5/22* (2006.01)
*H01S 5/40* (2006.01)

(52) U.S. Cl.
CPC .............. *H01S 5/22* (2013.01); *H01S 5/2202* (2013.01); *H01S 5/4025* (2013.01)

(58) Field of Classification Search
CPC .......... H01S 5/22; H01S 5/2202; H01S 5/4025
See application file for complete search history.

(56) References Cited

U.S. PATENT DOCUMENTS

| 5,359,619 A | 10/1994 | Yoshida et al. |
| 5,780,320 A | 7/1998 | Kinoshita |
| 2009/0086782 A1* | 4/2009 | Yokoyama ............. B82Y 20/00 372/49.01 |

(Continued)

FOREIGN PATENT DOCUMENTS

| JP | H5-235480 A | 9/1993 | |
| JP | 07131069 A | * 5/1995 | ............. H01L 33/00 |
| JP | H8-116137 A | 5/1996 | |

(Continued)

OTHER PUBLICATIONS

Machine translation of JP07-131069 (Year: 1995).*

(Continued)

*Primary Examiner* — Yuanda Zhang
(74) *Attorney, Agent, or Firm* — McDermott Will & Emery LLP

(57) ABSTRACT

A semiconductor laser element includes: a substrate; and a laser array portion that includes a plurality of light emitting portions arranged side by side, and is stacked above the substrate, wherein a stacked body of the substrate and the laser array portion includes a pair of resonator end faces on opposite faces, and a groove portion that extends from the laser array portion into the substrate is provided on at least one of the pair of resonator end faces between two adjacent light emitting portions among the plurality of light emitting portions.

10 Claims, 16 Drawing Sheets

(56) References Cited

U.S. PATENT DOCUMENTS

2009/0262771 A1* 10/2009 Inoue .................... B82Y 20/00
   438/33
2009/0267100 A1* 10/2009 Miyake ................. B82Y 20/00
   438/33

FOREIGN PATENT DOCUMENTS

| JP | H10-012971 A | 1/1998 | | |
|----|----|----|----|----|
| JP | H10-335699 A | 12/1998 | | |
| JP | 2008-227058 A | 9/2008 | | |
| JP | 2009-088207 A | 4/2009 | | |
| JP | 2010-232614 A | 10/2010 | | |
| JP | 2011-233717 A | 11/2011 | | |
| JP | 2014138096 A | * | 7/2014 | ............. H01S 5/042 |

OTHER PUBLICATIONS

Japanese Office Action issued in corresponding Japanese Patent Application No. 2019-543474, dated Jun. 29, 2021, with English translation.
International Search Report issued in corresponding International Patent Application No. PCT/JP2018/029858, dated Nov. 6, 2018, with English translation.

* cited by examiner

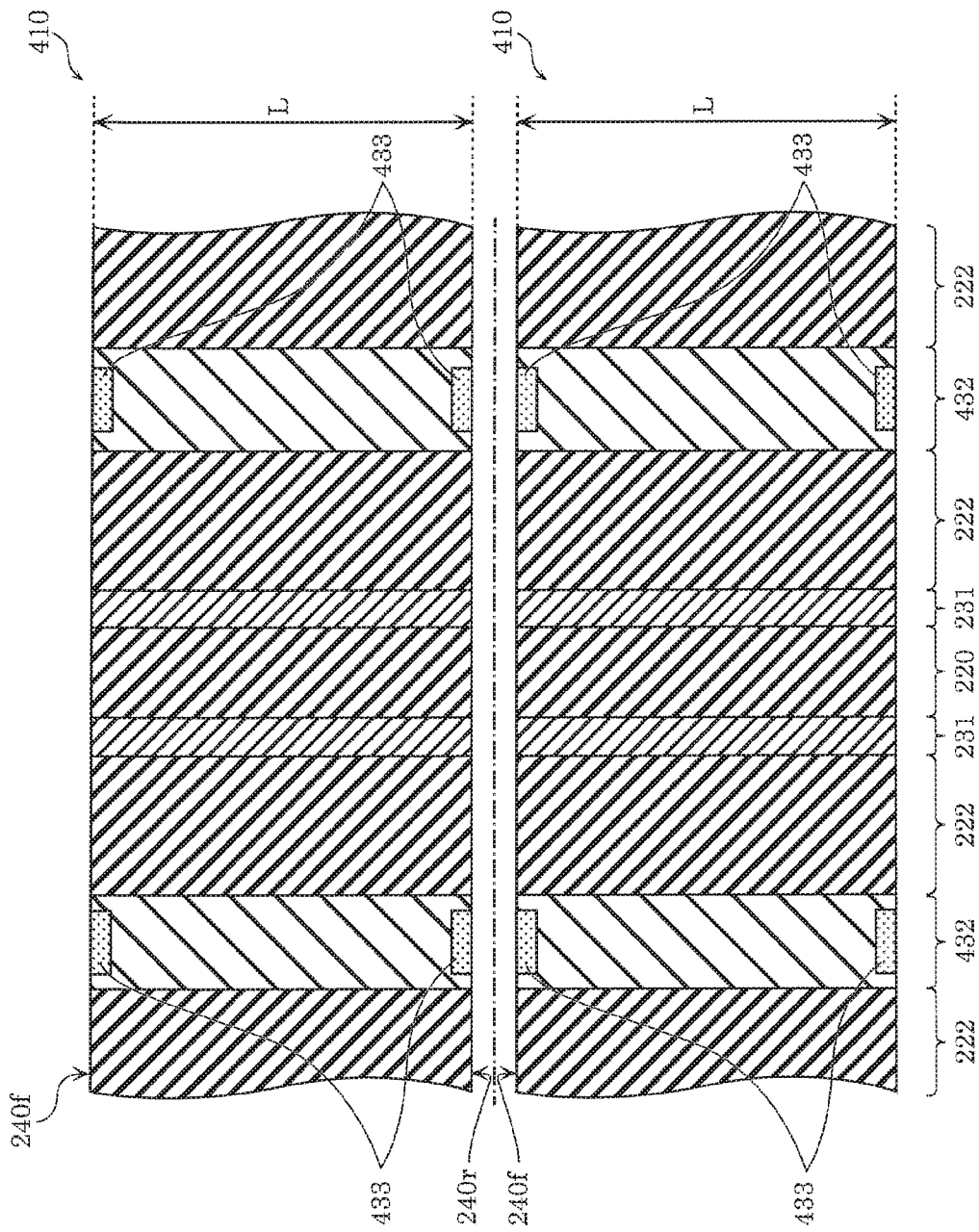

SEMICONDUCTOR LASER ELEMENT

CROSS-REFERENCE OF RELATED APPLICATIONS

This application is the U.S. National Phase under 35 U.S.C. § 371 of International Patent Application No. PCT/JP2018/029858, filed on Aug. 9, 2018, which in turn claims the benefit of Japanese Patent Application No. 2017-180002, filed on Sep. 20, 2017, the entire disclosures of which Applications are incorporated by reference herein.

TECHNICAL FIELD

The present disclosure relates to a semiconductor laser element, and more particularly to an arrayed semiconductor laser element having a plurality of light emitting portions.

Note that the present application relates to a contract research, 2016 New Energy and Industrial Technology Development Organization "Development of GaN-based high-power, high-beam quality semiconductor laser for high-brightness and high-efficiency next-generation laser technology development/new light source and element technology development for next-next-generation processing/high-efficiency processing", and is a patent application that is subject to "Industrial Technology Strengthening Law Article 19".

BACKGROUND ART

Conventionally, a monolithic semiconductor laser element in which a laser array portion having a plurality of light emitting portions is formed on a single substrate is known as a watt class high-power laser light source. In such a semiconductor laser element, suppression of thermal interference among the light emitting portions is achieved by providing separation grooves between the light emitting portions or filling the separation grooves with a material having low thermal conductivity.

For example, Patent Literature (PTL) 1 discloses a semiconductor laser element in which a separating portion in an insulator is embedded is formed between light emitting portions. Hereinafter, the semiconductor laser element disclosed in PTL 1 will be briefly described with reference to the drawings. FIG. 11 is a cross-sectional view showing a configuration of semiconductor laser element 1000 disclosed in PTL 1.

As shown in FIG. 11, semiconductor laser element 1000 disclosed in PTL 1 includes GaAs substrate 1001, buffer layer 1002, cladding layer 1003, active layer 1004, cladding layer 1005, current blocking layer 1006, cap layer 1007, contact layer 1008, and electrodes 1009 and 1010.

In semiconductor laser element 1000, a groove that extends into current blocking layer 1006 from contact layer 1008 to is provided. Adjacent light emitting portions are insulated and separated by insulator 1011 embedded in the groove.

In this way, the crosstalk of the current flowing through each light emitting portion is attempted to be reduced by insulating the light emitting portions from one another in semiconductor laser element 1000 disclosed in PTL 1.

CITATION LIST

Patent Literature

PTL 1: Japanese Unexamined Patent Application Publication No. H5-235480

SUMMARY OF THE INVENTION

Technical Problem

However, the size of the plurality of light emitting portions in the arrangement direction (that is, the direction perpendicular to the resonance direction) is large in semiconductor laser element 1000 disclosed in PTL 1. For this reason, the influence of distortion generated in the substrate increases in semiconductor laser element 1000, compared with a semiconductor laser element having a single light emitting portion. Thereby, the warpage of semiconductor laser element 1000 increases. Since the warpage of semiconductor laser element 1000 is large, height deviation of the plurality of light emitting portions occurs. Due to this height deviation, the coupling efficiency of the plurality of laser beams decreases when the laser beams from the plurality of light emitting portions are concentrated. That is, it becomes difficult to concentrate the light from the plurality of light emitting portions at one point.

The present disclosure solves such a problem, and an object thereof is to reduce warpage of a semiconductor laser element having a plurality of light emitting portions.

Solutions to Problem

In order to solve the above problem, an aspect of a semiconductor laser element according to the present disclosure includes a substrate; and a laser array portion that includes a plurality of light emitting portions arranged side by side, and is stacked above the substrate, wherein a stacked body of the substrate and the laser array portion includes a pair of resonator end faces on opposite faces, and a groove portion that extends from the laser array portion into the substrate is provided on at least one of the pair of resonator end faces between two adjacent light emitting portions among the plurality of light emitting portions.

In this way, since the groove portion that extends from the laser array portion into the substrate is formed, the distortion is divided by the groove portion. For this reason, distortion generated in the substrate can be reduced. Therefore, it is possible to reduce warpage in the arrangement direction of the plurality of light emitting portions of the substrate. Thereby, when the laser beams emitted from a plurality of light emitting portions are concentrated with a lens etc., the reduction of coupling efficiency clue to the warpage of the substrate can be suppressed.

Furthermore, in one aspect of the semiconductor laser element according to the present disclosure, the laser array portion may include a dividing groove that is continuous between the pair of resonator end faces between the two adjacent light emitting portions among the plurality of light emitting portions, and the groove portion is provided on a bottom surface of the dividing groove.

By providing such a dividing groove, thermal interference among a plurality of light emitting portions can be suppressed. Furthermore, the amount of etching required for forming the groove can be reduced by forming a groove portion on the bottom surface of the dividing groove as compared with the case where the groove is formed at a position other than the dividing groove.

Furthermore, in one aspect of the semiconductor laser element according to the present disclosure, a side wall of the groove portion may be disposed inside the dividing groove relative to a side wall of the dividing groove.

Thereby, the groove portion can be easily formed by etching the central portion in the width direction of the bottom surface of the dividing groove.

Furthermore, in one aspect of the semiconductor laser element according to the present disclosure, the laser array portion may include a first semiconductor layer of a first conductivity type, an active layer, and a second semiconductor layer of a second conductivity type in stated order from the substrate side, the second semiconductor layer includes a plurality of ridge stripe portions that serve as current paths, support portions that are disposed on both sides of the ridge stripe portions and do not serve as current paths, and separation grooves that separate the ridge stripe portions and the support portions, and the dividing groove is provided in the support portions.

In this way, since the second semiconductor layer includes the support portion, it is possible to reduce the stress caused by the concentration of the load on the ridge stripe portions when the semiconductor laser element is subjected to the junction down mounting.

Furthermore, in one aspect of the semiconductor laser element according to the present disclosure, the groove portion may extend from an upper surface of the laser array portion into the substrate.

Thereby, since the groove portion can be formed directly from the upper surface of the laser array portion without forming the dividing groove, the manufacturing process of the semiconductor laser element can be simplified.

Furthermore, in one aspect of the semiconductor laser element according to the present disclosure, the laser array portion may include a first semiconductor layer of a first conductivity type, an active layer, and a second semiconductor layer of a second conductivity type in stated order from the substrate side, the second semiconductor layer includes a plurality of ridge stripe portions that serve as current paths, support portions that are disposed on both sides of the ridge stripe portions and do not serve as current paths, and separation grooves that separate the ridge stripe portions and the support portions, and the groove portion is provided in the support portions.

In this way, since the second semiconductor layer includes the support portions, it is possible to reduce the stress caused by the concentration of the load on the ridge stripe portions when the semiconductor laser element is subjected to the junction down mounting.

Furthermore, one aspect of a semiconductor laser element according to the present disclosure includes a substrate; and a laser array portion that has a plurality of light emitting portions arranged side by side, and is stacked above the substrate, wherein a stacked body of the substrate and the laser array portion includes a pair of resonator end faces on opposite faces, and a groove portion that extends from a lower surface of the substrate into the substrate is provided on at least one of the pair of resonator end faces between two adjacent light emitting portions among the plurality of light emitting portions.

In this way, since the groove portion that reaches a middle of the substrate from the lower surface of the substrate is formed, the distortion is divided by the groove portion. For this reason, distortion generated in the substrate can be reduced. Therefore, it is possible to reduce warpage in the arrangement direction of the plurality of light emitting portions of the substrate. Thereby, when the laser beams emitted from a plurality of light emitting portions are concentrated with a lens etc., the reduction of coupling efficiency due to the warpage of the substrate can be suppressed.

Furthermore, in one aspect of the semiconductor laser element according to the present disclosure, the laser array portion may include a dividing groove that is continuous between the pair of resonator end faces between the two adjacent light emitting portions among the plurality of light emitting portions, and the groove portion is provided at a position facing the dividing groove on the lower surface of the substrate.

In this way, it is possible to reduce the generation of cracks in the ridge stripe portions and their vicinity along with the formation of the groove portion by forming the groove portion at a position facing the dividing groove, that is, a position relatively distant from the ridge stripe portions.

Furthermore, in one aspect of the semiconductor laser element according to the present disclosure, the laser array portion may include a first semiconductor layer of a first conductivity type, an active layer, and a second semiconductor layer of a second conductivity type in stated order from the substrate side, the second semiconductor layer includes a plurality of ridge stripe portions that serve as current paths, support portions that are disposed on both sides of the ridge stripe portions and do not serve as current paths, and separation grooves that separate the ridge stripe portions and the support portions, and the dividing groove is provided in the support portions.

In this way, since the second semiconductor layer includes the support portions, it is possible to reduce the stress caused by the concentration of the load on the ridge stripe portions when the semiconductor laser element is subjected to the junction down mounting.

Furthermore, in one aspect of the semiconductor laser element according to the present disclosure, the groove portion may reach a middle of the substrate from an upper surface of the laser array portion.

In this case, since the active layer that can be at the highest temperature can be separated for each ridge stripe portion, thermal interference among a plurality of ridge stripe portions can be further suppressed. Thereby, since the diffusion of heat from each ridge stripe portion toward the substrate can be promoted, the output of the semiconductor laser element can be increased.

Moreover, in one aspect of the semiconductor laser element according to the present disclosure, a depth of a portion of the substrate of the groove portion may be 2.0 μm or more.

This can reduce the distortion generated in the substrate more reliably.

Advantageous Effect of Invention

According to the present disclosure, it is possible to reduce the warpage of the semiconductor laser element having a plurality of light emitting portions.

BRIEF DESCRIPTION OF DRAWINGS

FIG. 9I is a schematic plan view showing a cleavage step of the method of manufacturing the semiconductor laser element according to Embodiment 3.

DESCRIPTION OF EXEMPLARY EMBODIMENTS

Figure 1:
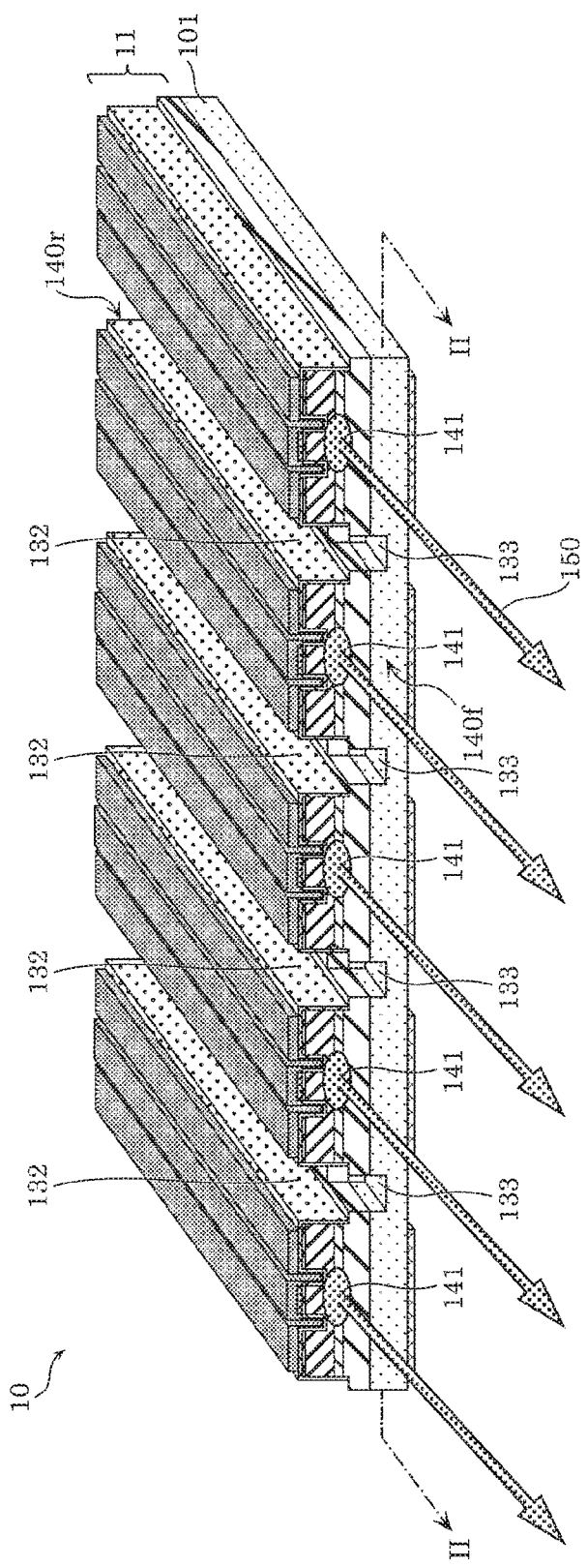
FIG. 1 is a schematic external perspective view showing a structure of a semiconductor laser element according to Embodiment 1.

Hereinafter, embodiments of the present disclosure will be described with reference to the drawings. Note that each of the embodiments described below shows a specific example of the present disclosure. Therefore, numerical values, shapes, materials, components, and arrangement positions and connection forms of the components shown in the following embodiments are merely examples, and are not intended to limit the present disclosure. Therefore, components that are not described in the independent claims indicating the highest concept of the present disclosure among the components in the following embodiments are described as arbitrary components.

In addition, each figure is a schematic diagram and is not necessarily illustrated strictly. Accordingly, the scales and the like do not necessarily match in each drawing. Note that in each figure, substantially the same configuration is denoted by the same reference numeral, and redundant description is omitted or simplified.

Furthermore, the terms "upper" and "lower" are used in this specification as terms which do not refer to the upward direction (vertically upward) and the downward direction (vertically downward) in absolute space recognition, but are defined by the relative positional relationship based on the stacking order in the stacking configuration. In addition, the terms "upper" and "lower" are also applied not only when two components are spaced apart from each other and there is another component between the two components, but also when two components are arranged in contact with each other.

Embodiment 1

A semiconductor laser element according to Embodiment 1 will be described.

[1-1. Structure]

Figure 2:
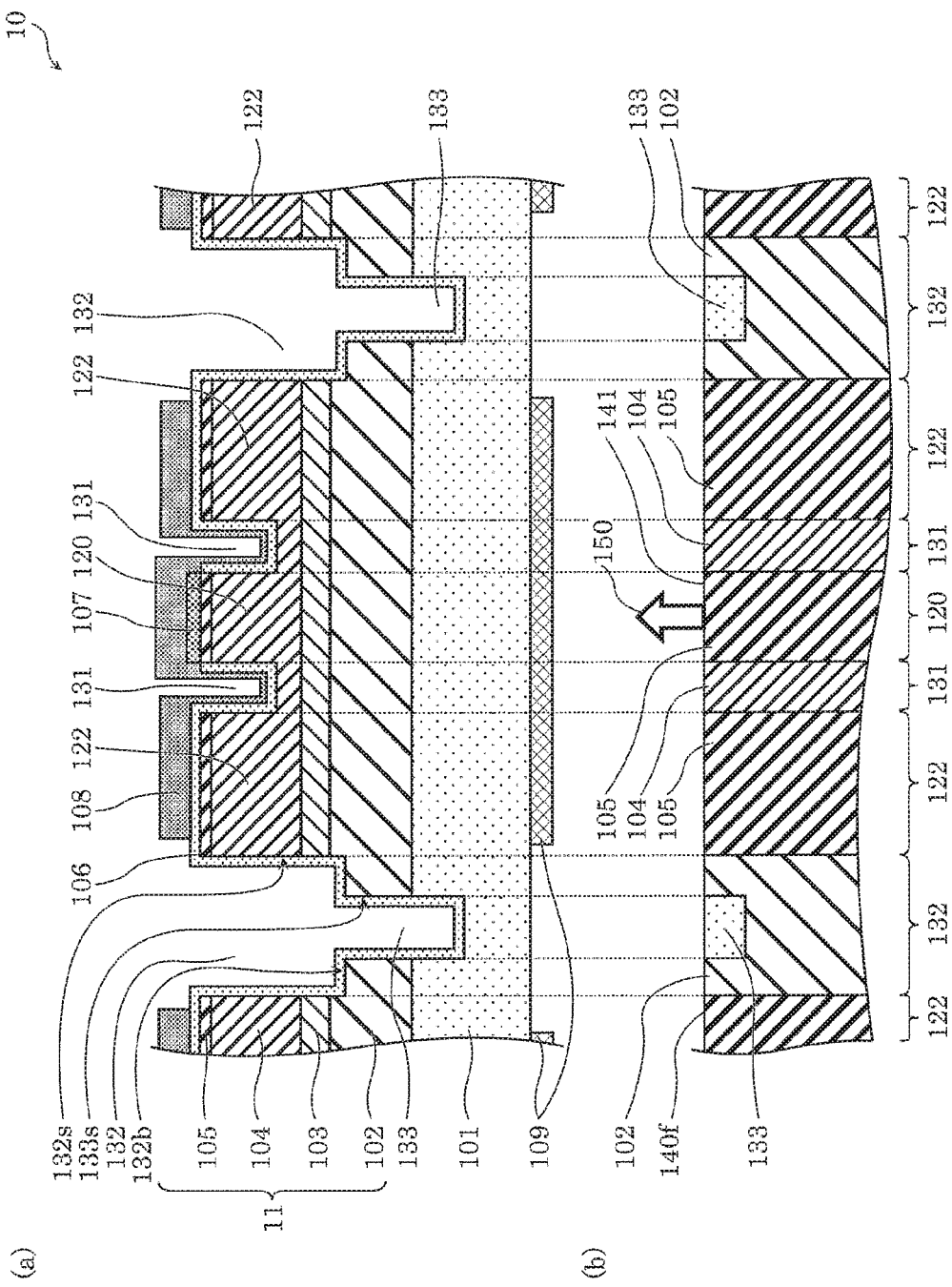
FIG. 2 is a schematic cross-sectional view and plan view showing the structure of the semiconductor laser element according to Embodiment 1.

First, a structure of the semiconductor laser element according to the present embodiment will be described with reference to the drawings. FIG. 1 is a schematic external perspective view showing the structure of semiconductor laser element 10 according to the present embodiment. FIG. 2 is a schematic cross-sectional view and plan view showing the structure of semiconductor laser element 10 according to the present embodiment. The cross-sectional view (a) of FIG. 2 shows a II-11 cross-section of FIG. 1. The plan view (b) of FIG. 2 is a plan view in the vicinity of resonator end face 140f on the front side of semiconductor laser element 10. In the plan view (b) of FIG. 2, insulating layer 106, p-electrode 107 and pad electrode 108 are removed to show the structure of the semiconductor layer of semiconductor laser element 10.

Semiconductor laser element 10 according to the present embodiment is a laser array element having a plurality of light emitting portions 141. Semiconductor laser element 10 emits red laser beam 150 and is used, for example, as a light source for a projector. The application of semiconductor laser element 10 is not limited to a projector. Semiconductor laser element 10 may be used for, for example, a laser display, a laser printer, laser processing, and the like.

As shown in FIG. 1, semiconductor laser element 10 includes substrate 101, and laser array portion 11 that has a plurality of light emitting portions 141 arranged side by side, and is stacked above substrate 101. Semiconductor laser element 10 further includes n-electrode 109 disposed on the lower surface of substrate 101 as shown in the cross-sectional view (a) of FIG. 2.

As shown in FIG. 1, a stacked body of substrate 101 and laser array portion 11 includes a pair of resonator end faces 140f and 140r on opposite surfaces. The pair of resonator end faces 140f and 140r are front side and rear-side resonator mirrors of semiconductor laser element 10, respectively. Plurality of light emitting portions 141 are provided on front-side resonator end face 140f.

In the present embodiment, the distance between the pair of resonator end faces 140f and 140r, that is, the resonator length is 1.5 mm, but the resonator length is not limited thereto. For example, it may be 1.2 mm or more, and 4 mm or less.

As shown in FIG. 1, groove portion 133 that reaches a middle of substrate 101 from laser array portion 11 on at least one of the pair of resonator end faces 140f and 140r is formed between two adjacent light emitting portions 141 among the plurality of light emitting portions 141 of laser array portion 11.

Furthermore, laser array portion 11 includes dividing groove 132 that is continuous between the pair of resonator end faces 140f and 140r between two adjacent light emitting portions 141 among the plurality of light emitting portions 141 in the present embodiment. Groove portion 133 is formed on bottom surface 132b of dividing groove 132, as shown in the cross-sectional view (a) of FIG. 2. Furthermore, side wall 133s of groove portion 133 is disposed inside dividing groove 132 from side wall 132s of dividing groove 132. The operation and effect of groove portion 133 and dividing groove 132 will be described later.

Substrate 101 is a base material of semiconductor laser element 10. In the present embodiment, substrate 101 is a GaAs substrate having a thickness of 100 μm. Note that the thickness of substrate 101 is not limited to 100 μm, and may be, for example, 50 μm or more and 120 μm or less.

In the example shown in FIG. 1, laser array portion 11 has five light emitting portions 141 arranged in a line. Note that the number of light emitting portions 141 is only needed to be plural, and is only needed to be appropriately determined according to the light output required for semiconductor laser element 10. Laser array portion 11 includes a first conductive type first semiconductor layer, active layer 103, and a second conductive type second semiconductor layer in stated order from the substrate 101 side. Laser array portion 11 further includes insulating layer 106, p-electrode 107, and pad electrode 108.

The first semiconductor layer is a semiconductor layer of a first conductivity type and is disposed above substrate 101. In the present embodiment, n-side cladding layer 102 is included in the first semiconductor layer.

The second semiconductor layer is a semiconductor layer of a second conductivity type different from the first conductivity type, and is disposed above active layer 103. In the present embodiment, the second semiconductor layer includes p-side cladding layer 104 and p-side contact layer 105.

As shown in FIG. 2, the second semiconductor layer (that is, p-side cladding layer 104 and p-side contact layer 105) includes a plurality of ridge stripe portions 120 that serve as current paths and support portions 122 that are disposed on both sides of ridge stripe portions 120 and do not serve as current paths. In the present embodiment, dividing groove 132 is formed in support portions 122. By providing such support portions 122, it is possible to reduce the stress caused by the load being concentrated on ridge stripe portions 120 when semiconductor laser element 10 is subjected to junction down mounting.

In the present embodiment, the width of ridge stripe portion 120 is 20 μm. Note that the width of ridge stripe portion 120 is not limited thereto, and may be, for example, 5 μm or more and 50 μm or less.

The height of the upper surface of support portion 122 from substrate 101 is equal to the height of the upper surface of ridge stripe portion 120 from substrate 101. As a result, when semiconductor laser element 10 is subject to junction down mounting, the stress caused by the load being concentrated on ridge stripe portion 120 can be more reliably reduced. Note that here, the configuration indicated by the description that the height of the upper surface of support portion 122 from substrate 101 is equal to the height of the upper surface of ridge stripe portion 120 from substrate 101 includes not only a configuration in which these heights are completely equal, but also a configuration in which these heights are substantially equal. For example, a configuration in which these heights have an error of about 10% or less of the thickness of the second semiconductor layer is included.

In the present embodiment, the width of support portion 122 is 115 μm. Note that the width of support portion 122 is not limited thereto, and may be 30 μm or more and 200 μm or less. By setting the width to 30 μm or more, it is possible to reliably reduce the stress generated in ridge stripe portions 120 when semiconductor laser element 10 is subject to junction down mounting. Furthermore, since the distance between adjacent light emitting portions 141 can be reduced by setting the width to 200 μm or less, the coupling of laser beams output from the plurality of light emitting portions 141 can be facilitated.

The second semiconductor layer further includes separation grooves 131 that separate ridge stripe portions 120 and support portions 122. Current and light can be confined in ridge stripe portions 120 by separation grooves 131. In the present embodiment, the width and depth of separation grooves 131 are 10 μm and 1 μm, respectively. Note that the configuration of separation grooves 131 is not limited thereto. The width of separation grooves 131 may be 5 μm or more and 30 μm or less. Furthermore, the depth of separation grooves 131 may be 0.4 μm or more and a depth that does not reach active layer 103. When the thickness of the second semiconductor layer is larger than 2.0 μm, the depth of separation grooves 131 may be 2.0 μm or less.

N-side cladding layer 102 is a cladding layer included in the first semiconductor layer, and in the present embodiment, is a layer made of n-$(Al_{0.4}Ga_{0.6})_{0.5}In_{0.5}P$ having a thickness of 2 μm. Note that the configuration of n-side cladding layer 102 is not limited thereto. Tire thickness of n-side cladding layer 102 may be 1.2 μm or more, and the composition may be n-$(Al_xGa_{1-x})_{1-y}In_yP$ ($0<x<1$, $0<y<1$).

Active layer 103 is a light emitting layer disposed above the first semiconductor layer. In the present embodiment, active layer 103 is a quantum well active layer in which well layers made of GaInP and barrier layers made of $(Al_{0.5}Ga_{0.5})_{0.5}In_{0.5}P$ are alternately stacked, and has two well layers. By providing such active layer 103, semiconductor laser element 10 can emit a red laser beam having a wavelength of about 660 nm. The configuration of active layer 103 is not limited thereto, and it is only needed to be a quantum well active layer in which well layers made of GaInP and barrier layers made of $(Al_xGa_{1-x})_{1-y}In_yP$ ($0<x<1$, $0<y<1$) are alternately stacked. Note that active layer 103 may include a guide layer formed at least above or below the quantum well active layer. A region serving as a current path in active layer 103, that is, a region below ridge stripe portion 120 emits light. Therefore, a region below ridge stripe portion 120 in the side surfaces of active layer 103 in front-side resonator end face 140f forms light emitting portion 141.

P-side cladding layer 104 is a cladding layer included in the second semiconductor layer, and in the present embodiment, is a layer made of p-$(Al_{0.4}Ga_{0.6})_{0.5}In_{0.5}P$ having a thickness of 1 μm. Note that the configuration of p-side cladding layer 104 is not limited thereto. The thickness of p-side cladding layer 104 may be 0.6 μm or more and 1.8 μm or less, and the composition may be p-$(Al_xGa_{1-x})_{1-y}In_yP$ ($0<x<1$, $0<y<1$).

P-side contact layer 105 is a contact layer included in the second semiconductor layer and disposed above p-side cladding layer 104. In the present embodiment, p-side contact layer 105 is a layer made of p-GaAs having a thickness of 0.4 μm. Note that the configuration of p-side contact layer 105 is not limited thereto. The thickness of p-side contact layer 105 may be 0.1 μm or more and 0.8 μm or less.

Insulating layer 106 is a layer that insulates between pad electrode 108 disposed above the second semiconductor layer and the second semiconductor layer. Insulating layer 106 is also disposed on groove portions 133, dividing grooves 132 and separation grooves 131. In addition, insulating layer 106 has openings for contacting p-side contact layer 105 with p-electrode 107 above ridge stripe portion 120. Note that the openings of insulating layer 106 may have a slit shape. In the present embodiment, insulating layer 106 is a layer made of $SiO_2$ having a thickness of 700 nm. Note that the configuration of insulating layer 106 is not limited thereto. The thickness of insulating layer 106 may be 100 nm or more and 1000 nm or less.

P-electrode 107 is an electrode disposed above p-side contact layer 105 and in ohmic contact with p-side contact layer 105. P-electrode 107 is disposed above ridge stripe portion 120. That is, p-electrode 107 is disposed in the opening of insulating layer 106. Note that p-electrode 107 may also be disposed above insulating layer 106. P-electrode 107 is in contact with p-side contact layer 105 at the opening of insulating layer 106. In the present embodiment, p-electrode 107 is a stacked film in which Cr, Pt and Au are stacked in stated order from the p-side contact layer 105 side. The configuration of p-electrode 107 is not limited thereto. P-electrode 107 may be, for example, a single layer film or a multilayer film formed of at least one of Cr, Ti, Ni, Pd, Pt and Au.

Pad electrode 108 is a pad-like electrode disposed above p-electrode 107. In the present embodiment, pad electrode 108 is a stacked film in which Ti and Au are stacked in stated order from the p-electrode 107 side, and is disposed above ridge stripe portion 120 and support portion 122. The configuration of pad electrode 108 is not limited thereto. Pad electrode 108 may be, for example, a stacked film of Ti, Pt and Au, Ni and Au and the like.

N-electrode 109 is an electrode disposed below substrate 101. In the present embodiment, n-electrode 109 is a stacked film in which an AuGeNi alloy and Au are stacked in stated order from the substrate 101 side. The configuration of n-electrode 109 is not limited thereto. N-electrode 109 may be formed of any other conductive materials.

[1-2. Operation and Effect]

Figure 3:
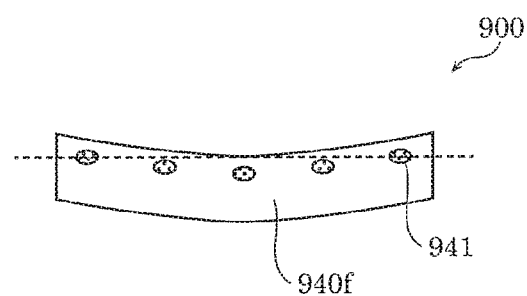
FIG. 3 is a schematic front view showing a resonator end face on the front side of a semiconductor laser element of a comparative example.
Figure 4:
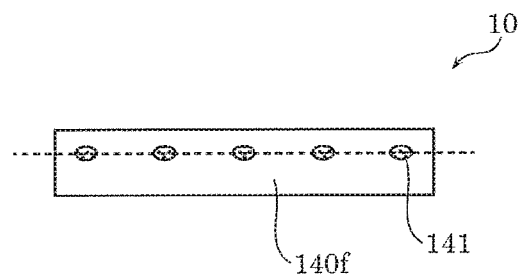
FIG. 4 is a schematic front view showing a resonator end face on the front side of the semiconductor laser element according to Embodiment 1.

The operation and effect of semiconductor laser element 10 according to the present embodiment will be described with reference to the drawings while comparing with a comparative example. FIG. 3 is a schematic front view showing front-side resonator end face 940f of semiconductor laser element 900 of the comparative example. FIG. 4 is a schematic front view showing front-side resonator end face 140f of semiconductor laser element 10 according to the present embodiment.

Semiconductor laser element 900 of the comparative example shown in FIG. 3 is different from semiconductor laser element 10 according to the present embodiment in that semiconductor laser element 900 does not include any groove portions 133, and is identical in other points.

Since semiconductor laser element 900 of the comparative example has a plurality of light emitting portions 941 arranged side by side, the size of the plurality of light emitting portions 941 in the arrangement direction (in other words, the direction perpendicular to the resonance direction) is larger than the size of the semiconductor laser element having a single light emitting portion. For this reason, the influence of the distortion generated in the substrate increases in semiconductor laser element 900, and warpage in the arrangement direction of the plurality of light emitting portions 941 is increased as shown in FIG. 3.

On the other hand, since groove portion 133 that reaches a middle of substrate 101 from laser array portion 11 is formed in semiconductor laser element 10 according to the present embodiment as described above, the distortion is divided by groove portion 133. For this reason, distortion generated in substrate 101 can be reduced. Therefore, it is possible to reduce warpage in the arrangement direction of the plurality of light emitting portions 141 of substrate 101 as shown in FIG. 4. Thereby, when the laser beams emitted from the plurality of light emitting portions 141 are concentrated with a lens etc., the reduction of coupling efficiency due to the warpage of substrate 101 can be suppressed.

In addition, since groove portion 133 is disposed on at least one of the pair of resonator end faces 140f and 140r, it becomes possible to reduce lattice mismatch distortion caused by the lattice constant difference between the first semiconductor layer and substrate 101, and thermal distortion caused by the difference in thermal expansion coefficient. For this reason, it becomes possible to relieve the distortion in active layer 103, improve the polarization characteristics of semiconductor laser element 10, and realize semiconductor laser element 10 having a good polarization ratio in which the TE mode is dominant.

In the present embodiment, the depth of the portion of substrate 101 in groove portion 133 is 10 μm, but the depth is not limited thereto. The depth may be 2.0 μm or more. Thereby, the effect described above can be obtained reliably. Furthermore, the depth may be smaller than the thickness of substrate 10 by 120 μm or more. Since the thickness of substrate 101 is usually 50 μm or more and 120 μm or less, the depth may be 100 μm or less. Thereby, the strength of substrate 101 can be ensured.

In addition, the length of groove 133 in the resonance direction is 5 μm in the present embodiment, but the length is not limited thereto. The length may be 1 μm or more. Thereby, the effect described above can be obtained reliably. Furthermore, the length may be less than half of the resonator length. That is, groove portion 133 may not be continuous between the pair of resonator end faces 140f and 140r. Thereby, the strength of substrate 101 can be ensured. Furthermore, the length may be 30 μm or less. Thereby, the strength of substrate 101 can be ensured still more reliably.

In the present embodiment, the width of groove portion 133 is 10 μm, but the width is not limited thereto. The width may be 1 μm or more. Thereby, the effect described above can be obtained reliably. In addition, the width may be 30 µm or less. Thereby, the strength of substrate 101 can be ensured.

In addition, semiconductor laser element 10 according to the present embodiment includes dividing groove 132 that is continuous between the pair of resonator end faces 140f and 140r between adjacent light emitting portions 141. Thereby, thermal interference among the plurality of ridge stripe portions 120 (that is, between the plurality of light emitting portions 141) can be suppressed. In the present embodiment, dividing groove 132 reaches a middle of the first semiconductor layer from the upper surface of laser array portion 11 beyond the second semiconductor layer and active layer 103. In this case, since active layer 103 that can reach the highest temperature can be separated for each ridge stripe portion 120, thermal interference among the plurality of ridge stripe portions 120 can be further suppressed. Thereby, since the diffusion of heat from each ridge stripe portion 120 toward substrate 101 can be promoted, the output of semiconductor laser element 10 can be increased.

In addition, groove portion 133 is formed on bottom surface 132b of dividing groove 132 in the present embodiment. Thereby, the etching amount required when forming groove portion 133 can be reduced as compared with the case where groove portion 133 is formed at a position other than dividing groove 132.

In the present embodiment, the depth of dividing groove 132 is 2.5 µm, but is not limited thereto. The depth of dividing groove 132 may be 2.0 µm or more. Thereby, the thermal interference suppression effect can be obtained. Dividing groove 132 may not reach substrate 101. Alternatively, the depth of dividing groove 132 may be 4.0 µm or less. Thereby, when a load is applied to semiconductor laser element 10 at the time of mounting, it is possible to suppress the occurrence of cracks.

In the present embodiment, the width of dividing groove 132 is 30 µm, but is not limited thereto. The width of dividing groove 132 may be 10 µm or more and 100 µm or less. By setting the width of dividing groove 132 to 10 µm or more, thermal interference among the plurality of ridge stripe portions 120 can be reliably suppressed. Since the distance between adjacent light emitting portions 141 can be reduced by setting the width of dividing groove 132 to 100 µm or less, the coupling of laser beams output from the plurality of light emitting portions 141 can be facilitated. In addition, a decrease in strength of semiconductor laser element 10 due to dividing groove 132 can be suppressed.

[1-3. Manufacturing Method]

A method for manufacturing semiconductor laser element 10 according to the present embodiment will be described with reference to the drawings. FIGS. 5A to 5G are schematic cross-sectional views showing the respective steps of the method for manufacturing semiconductor laser element 10 according to the present embodiment. FIGS. 5A to 5G show a cross-section similar to that of FIG. 2 of semiconductor laser element 10. FIG. 5H is a schematic plan view showing a cleavage step in the method for manufacturing semiconductor laser element 10 according to the present embodiment. FIG. 5H, insulating layer 106, p-electrode 107 and pad electrode 108 are removed in order to show the structure of the semiconductor layer of semiconductor laser element 10.

Figure 5A:
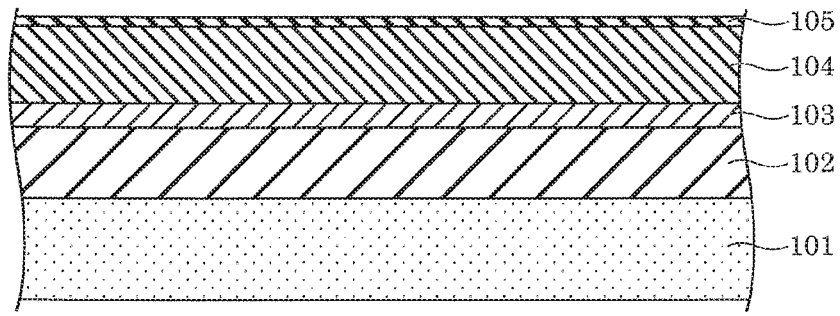
FIG. 5A is a schematic cross-sectional view showing a first step of a method of manufacturing the semiconductor laser element according to Embodiment 1.

As shown in FIG. 5A, first, substrate 101 is prepared, and a first semiconductor layer, active layer 103 and a second semiconductor layer are stacked in stated order. In the present embodiment, n-side cladding layer 102, active layer 103, p-side cladding layer 104 and p-side contact layer 105 are stacked on substrate 101 in stated order. In the present embodiment, each layer is deposited by metal organic chemical vapor deposition (MOCVD).

Figure 5B:
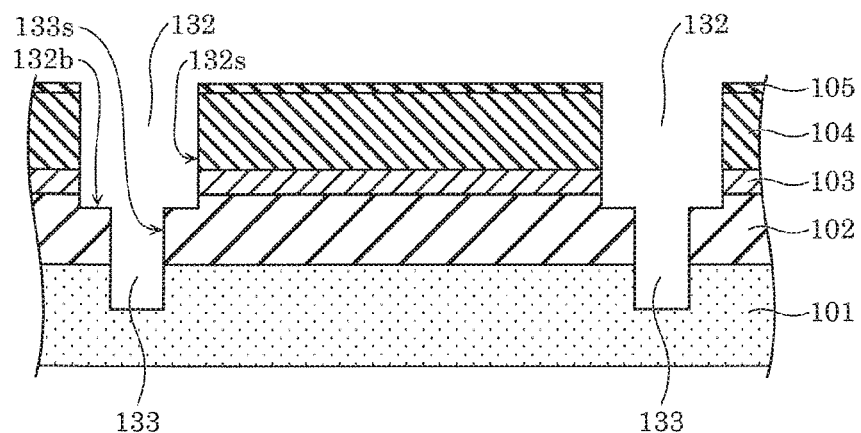
FIG. 5B is a schematic cross-sectional view showing a second step of the method of manufacturing the semiconductor laser element according to Embodiment 1.

Next, as shown in FIG. 5B, dividing groove 132 and groove portion 133 are formed. Specifically, first, dividing groove 132 is formed at a position substantially corresponding to the middle of adjacent light emitting portions 141 by a wet etching method, a dry etching method, or the like. Dividing groove 132 is formed continuously, that is, without interruption, along the resonance direction of semiconductor laser element 10. Subsequently, groove portion 133 is formed on bottom surface 132b of dividing groove 132 by a wet etching method, a dry etching method, or the like. Groove portion 133 is formed at a position corresponding to resonator end faces 140f and 140r of semiconductor laser element 10. Since the etching depth can be reduced by forming groove portion 133 on bottom surface 132b of dividing groove 132 compared to the case of forming groove portion 133 from the upper surface of the second semiconductor layer, the amount of etching required for forming groove portion 133 can be reduced.

Furthermore, side wall 133s of groove portion 133 is disposed inside dividing groove 132 from side wall 132s of dividing groove 132. Such groove portion 133 is easily formed by etching the central portion in the width direction of bottom surface 132b of dividing groove 132.

Figure 5C:
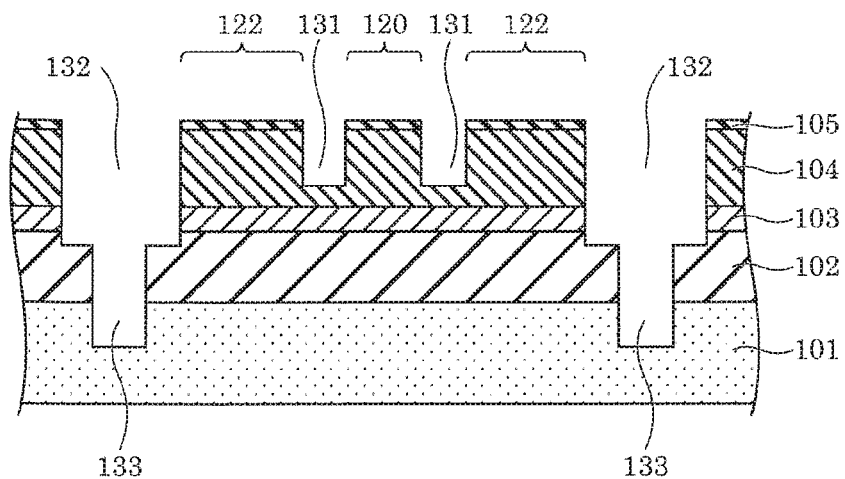
FIG. 5C is a schematic cross-sectional view showing a third step of the method of manufacturing the semiconductor laser element according to Embodiment 1.

Next, as shown in FIG. 5C, separation grooves 131 are formed by a wet etching method, a dry etching method or the like. Two separation grooves 131 are formed between each adjacent pair of dividing grooves 132. The portion between two separation grooves 131 of the second semiconductor layer (p-side cladding layer 104 and p-side contact layer 105 in the present embodiment) becomes ridge stripe portion 120, and the portion between separation groove 131 and dividing groove 132 becomes support portion 122.

Figure 5D:
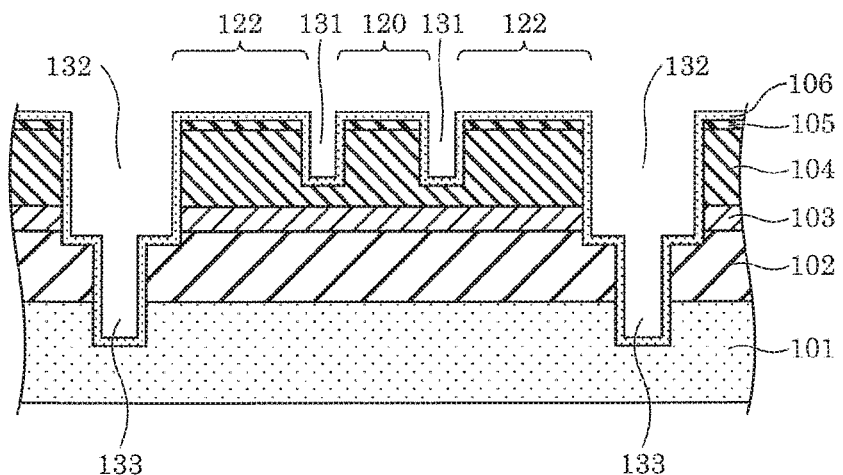
FIG. 5D is a schematic cross-sectional view showing a fourth step of the method of manufacturing the semiconductor laser element according to Embodiment 1.

Next, as shown in FIG. 5D, insulating layer 106 is formed by a plasma CVD method or the like. Insulating layer 106 is formed on the entire surface above substrate 101, that is, on the second semiconductor layer, separation grooves 131, dividing grooves 132 and groove portions 133.

Figure 5E:
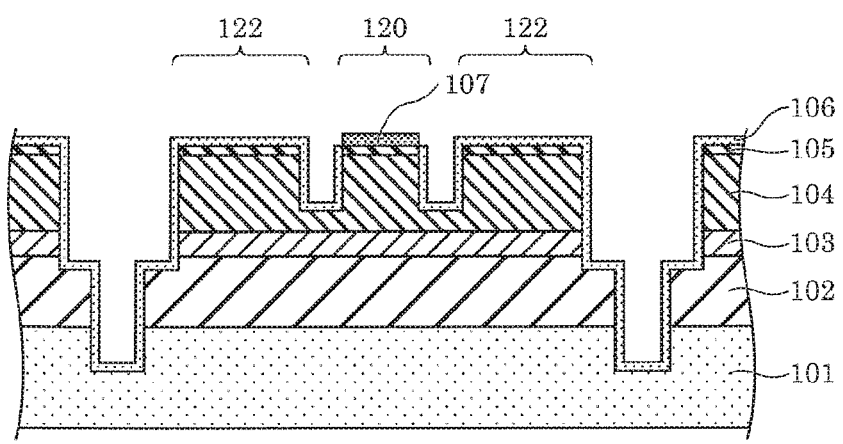
FIG. 5E is a schematic cross-sectional view showing a fifth step of the method of manufacturing a semiconductor laser element according to Embodiment 1.

Next, as shown in FIG. 5E, openings are formed in insulating layer 106, and p-electrode 107 is formed in the opening. First, openings are formed by removing a portion of insulating layer 106 above ridge stripe portions 120 by a wet etching method or the like. As a result, p-side contact layer 105 is exposed in the opening. Subsequently, p-electrode 107 is formed on p-side contact layer 105 in the opening by vacuum deposition or the like. Note that p-electrode 107 may also be formed above insulating layer 106.

Figure 5F:
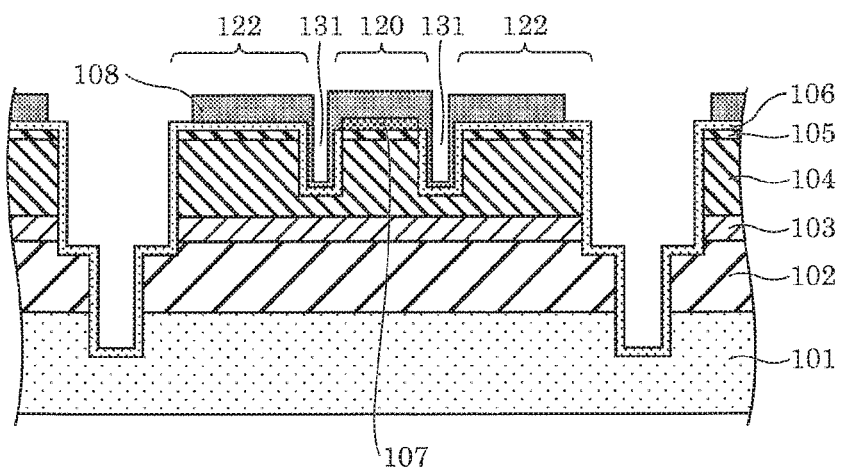
FIG. 5F is a schematic cross-sectional view showing a sixth step of the method of manufacturing the semiconductor laser element according to Embodiment 1.

Next, as shown in FIG. 5F, pad electrodes 108 are formed above the second semiconductor layer by vacuum deposition or the like. In the present embodiment, pad electrode 108 is formed on ridge stripe portion 120 so as to cover p-electrode 107. Note that pad electrode 108 may also be formed above separation grooves 131 and support portions 122 as shown in FIG. 5F.

Figure 5G:
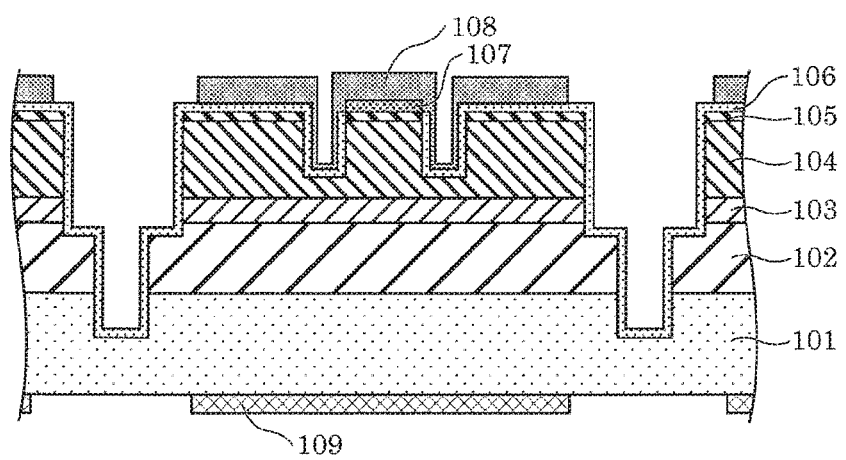
FIG. 5G is a schematic cross-sectional view showing a seventh step of the method for manufacturing the semiconductor laser element according to Embodiment 1.
Figure 5H:
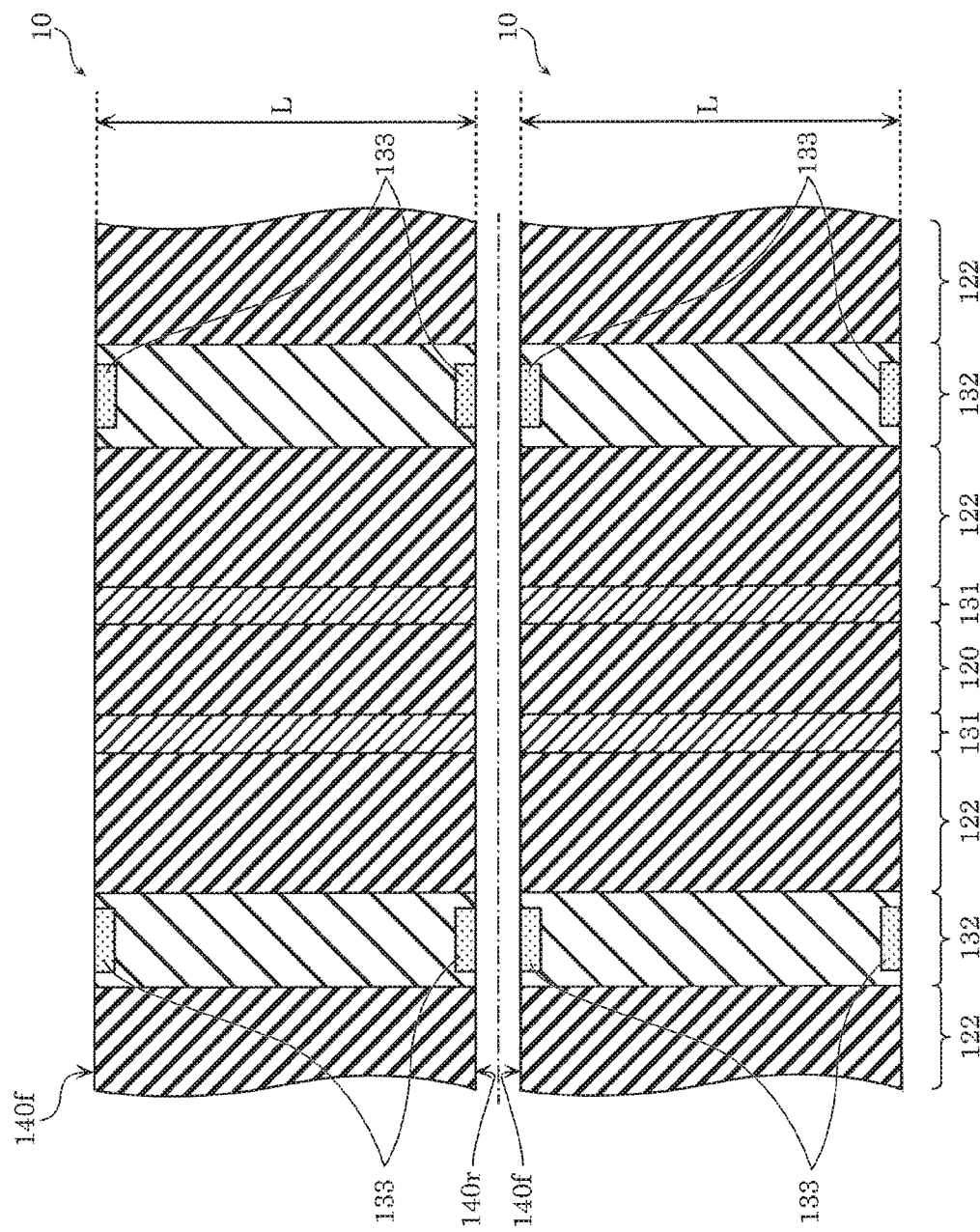
FIG. 5H is a schematic plan view showing a cleavage step of the method of manufacturing the semiconductor laser element according to Embodiment 1.

Next, as shown in FIG. 5G, n-electrodes 109 are formed on the lower surface of substrate 101 by vacuum deposition or the like. N-electrode 109 is formed at a position corresponding to the back side of ridge stripe portion 120 on the lower surface of substrate 101.

Next, as shown in FIG. 5H, resonator end faces 140f and 140r are formed by cleavage. Specifically, a scratch serving as a cleavage starting point is formed at a position corresponding to resonator end faces 140f and 140r of substrate 101, and substrate 101 is cleaved while applying the blade tip to the scratch. In FIG. 5H, the distance between resonator end faces 140*f* and 140*r*, that is, resonator length L is shown. Note that a reflective film such as a dielectric multilayer film may be formed on resonator end faces 140*f* and 140*r*.

Semiconductor laser element 10 according to the present embodiment can be manufactured through the steps as described above. Note that in the above manufacturing method, groove portions 133 are formed before insulating layer 106 and the like are stacked, but groove portions 133 may be formed after pad electrodes 108 and n-electrodes 109 are formed using a laser scribing device or the like.

[1-4. Variation]

A semiconductor laser element according to a variation of the present embodiment will be described. In the above, an example in which an AlGaInP-based material is used as semiconductor laser element 10 is shown, but the material used for the semiconductor laser element according to the present embodiment is not limited thereto, and GaN, GaAs or the like may be used. Hereinafter, a configuration using a GaN-based material as a semiconductor laser element according to a variation of the present embodiment will be described with reference to the drawings with a focus on differences from semiconductor laser element 10 described above.

Figure 6:
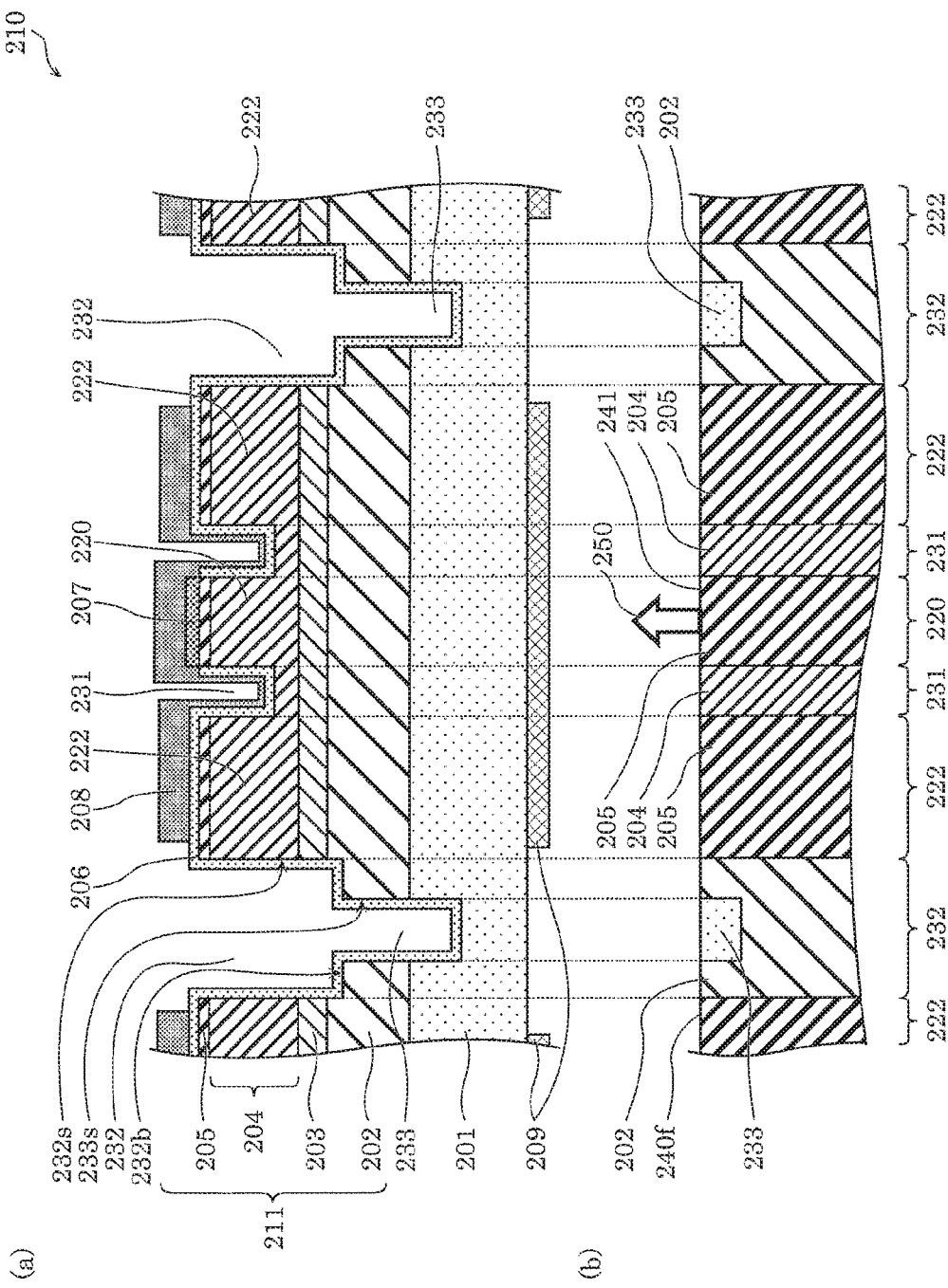
FIG. 6 is a schematic cross-sectional view and plan view showing a structure of a semiconductor laser element according to a variation of Embodiment 1.

FIG. 6 is a schematic cross-sectional view and plan view showing a structure of semiconductor laser element 210 according to the present variation. The cross-sectional view (a) of FIG. 6 shows a cross-section of semiconductor laser element 210 similar to the cross-sectional view (a) of FIG. 2. The plan view (b) of FIG. 6 is a plan view in the vicinity of front-side resonator end face 240*f* of semiconductor laser element 210. In the plan view (b) of FIG. 6, insulating layer 206, p-electrode 207 and pad electrode 208 are removed in order to show the structure of the semiconductor layer of semiconductor laser element 210.

Semiconductor laser element 210 according to the present variation is a laser array element having a plurality of light emitting portions 241. Semiconductor laser element 210 emits a blue laser beam 250.

As shown in FIG. 6, semiconductor laser element 210 includes substrate 201; and laser array portion 211 that has a plurality of light emitting portions 241 arranged side by side, and is stacked above substrate 201. Semiconductor laser element 210 further includes n-electrode 209 disposed on the lower surface of substrate 201 as shown in the cross-sectional view (a) of FIG. 6.

The stacked body of substrate 201 and laser array portion 211 includes a pair of resonator end faces on the opposing surfaces similarly to semiconductor laser element 10 described above. The plurality of light emitting portions 241 are provided on front-side resonator end face 240*f*.

In the present variation, the distance between the pair of resonator end faces, that is, the resonator length is 1.2 mm, but the resonator length is not limited, thereto. It may be, for example, 0.8 mm or more and 4 mm or less.

Similarly to semiconductor laser element 10, groove portion 233 that reaches a middle of substrate 201 from laser array portion 211 on at least one of the pair of resonator end faces is formed between the two adjacent light emitting portions 241 among the plurality of light emitting portions 241 of laser array portion 211.

In addition, laser array portion 211 includes dividing groove 232 that is continuous between a pair of resonator end faces between two adjacent light emitting portions 241 among the plurality of light emitting portions 241, and groove portion 233 is formed on bottom surface 232*b* of dividing groove 232. Furthermore, side wall 233*s* of groove portion 233 is disposed inside dividing groove 232 from side wall 232*s* of dividing groove 232.

In the present variation, the depth of dividing groove 232 is 1 μm, but is not limited thereto. The depth of dividing groove 232 may be 0.8 μm or more. Thereby, the thermal interference suppression effect can be obtained. Dividing groove 232 may not reach substrate 201. Alternatively, the depth of dividing groove 132 may be 3.0 μm or less. Thereby, when a load is applied to semiconductor laser element 210 at the time of mounting, it is possible to suppress the occurrence of cracks.

In the present variation, the width of dividing groove 232 is 30 μm, but is not limited thereto. The width of dividing groove 232 may be 10 μm or more and 100 μm or less. By setting the width of dividing groove 232 to 10 μm or more, thermal interference among the plurality of ridge stripe portions 220 can be reliably suppressed. Since the distance between adjacent light emitting portions 241 can be reduced by setting the width of dividing groove 232 to 100 μm or less, the coupling of laser beams output from the plurality of light emitting portions 241 can be facilitated, and the decrease in strength of semiconductor laser element 210 can be suppressed.

In the present variation, the depth of the portion of substrate 201 in groove portion 233 is 10 μm, hut the depth is not limited thereto. The depth may be 2.0 μm or more. Furthermore, the depth may be smaller than the thickness of substrate 201 by 20 μm or more. Since the thickness of substrate 201 is usually 50 μm or more and 120 μm or less, the depth may be 100 μm or less.

Substrate 201 is a GaN single crystal substrate having a thickness of 100 μm. Note that the thickness of substrate 201 is not limited to 100 μm, and may be, for example, 50 μm or more and 120 μm or less. In addition, the material forming substrate 201 is not limited to GaN single crystal, and may be sapphire, SiC or the like.

Laser array portion 211 includes a first conductive type first semiconductor layer, active layer 203, and a second conductive type second semiconductor layer in stated order from the substrate 201 side. Laser array portion 211 further includes insulating layer 206, p-electrode 207 and pad electrode 208.

In the present variation, the first semiconductor layer includes n-side cladding layer 202, and the second semiconductor layer includes p-side cladding layer 204 and p-side contact layer 205.

The second semiconductor layer (that is, p-side cladding layer 204 and p-side contact layer 205) includes a plurality of ridge stripe portions 220 that serve as current paths, and support portions 222 that are disposed on both sides of ridge stripe portions 220 and do not serve as current paths as shown in FIG. 6. In the present embodiment, dividing groove 232 is formed in support portion 222.

The height of the upper surface of support portion 222 from substrate 201 is equal to the height of the upper surface of ridge stripe portion 220 from substrate 201.

The second semiconductor layer further includes separation grooves 231 that separate ridge stripe portions 220 and support portions 222. In the present variation, the width and depth of separation grooves 231 are 10 μm and 0.5 μm, respectively. Note that the configuration of separation grooves 231 is not limited thereto. The width of separation grooves 231 may be 5 μm or more and 30 μm or less. Furthermore, the depth of separation grooves 231 may be 0.1 μm or more and a depth that does not reach active layer 203. When the thickness of the second semiconductor layer is larger than 0.6 μm, the depth of separation grooves 231 may be 0.6 μm or less.

In the present modification, n-side cladding layer 202 is a layer made of n-$Al_{0.2}Ga_{0.8}N$ having a thickness of 1 μm. Note that the configuration of n-side cladding layer 202 is not limited thereto. The thickness of n-side cladding layer 202 may be 0.5 μm or more, and the composition may be n-$Al_xGa_{1-x}N$ (0<x<1).

Active layer 203 is a quantum well active layer in which 5 nm thick well layers made of $In_{0.18}Ga_{0.82}N$ and 10 nm thick barrier layers made of GaN are alternately stacked, and has two well layers. By providing such active layer 203, semiconductor laser element 210 can emit a blue laser beam having a wavelength of about 450 nm. The configuration of active layer 203 is not limited thereto, and it is only needed to be a quantum well active layer in which well layers made of $In_xGa_{1-x}N$ (0<x<1) and barrier layers made of $Al_xIn_yGa_{1-x-y}N$ (0≤x+y≤1) are alternately stacked. Note that active layer 203 may include a guide layer formed at least above or below the quantum well active layer. A region serving as a current path in active layer 203, that is, a region below ridge stripe portion 220 emits light. Therefore, a region below ridge stripe portion 220 in the side surfaces of active layer 203 in front-side resonator end face 240f forms light emitting portion 241.

P-side cladding layer 204 is a cladding layer included in the second semiconductor layer. In the present embodiment, p-side cladding layer 204 is a superlattice layer in which 3 nm thick layers made of p-$Al_{0.2}Ga_{0.8}N$ and 3 nm thick layers made of GaN are alternately stacked by 100 layers. The configuration of p-side cladding layer 204 is not limited thereto, and may be a layer made of $Al_xGa_{1-x}N$ (0<x<1) having a thickness of 0.3 μm or more and 1 μm or less.

P-side contact layer 205 is a layer made of p-GaN having a thickness of 10 nm. Note that the configuration of p-side contact layer 205 is not limited thereto. The thickness of p-side contact layer 205 may be 5 nm or more.

Insulating layer 206 is a layer made of $SiO_2$ having a thickness of 200 nm. Note that the structure of insulating layer 206 is not limited thereto. The thickness of insulating layer 206 may be 100 nm or more and 500 nm or less.

P-electrode 207 is a stacked film in which Pd and Pt are stacked in stated order from the p-side contact layer 205 side. The configuration of p-electrode 207 is not limited thereto. P-electrode 207 may be, for example, a single layer film or a multilayer film formed of at least one of Cr, Ti, Ni, Pd, Pt and Au.

Pad electrode 208 is a pad-shaped electrode disposed above p-electrode 207. In the present embodiment, pad electrode 208 is a stacked film in which Ti and Au are stacked in stated order from the p-electrode 207 side, and is disposed above ridge stripe portion 220 and support portion 222. The configuration of pad electrode 208 is not limited thereto. Pad electrode 208 may be a stacked film of, for example, Ti, Pt and Au, Ni and Au and the like.

N-electrode 209 is a stacked film in which Ti, Pt, and Au are stacked in stated order from the substrate 201 side. The configuration of n-electrode 209 is not limited thereto. N-electrode 209 may be a stacked film in which Ti and Au are stacked.

Also in semiconductor laser element 210 according to the variation having the configuration as described above, the effect similar to that of semiconductor laser element 10 can be obtained. Furthermore, in general, when a GaN single crystal substrate is used as in the present variation, cleavage is difficult. However, in the present variation, since groove portion 233 that reaches substrate 201 is formed at a position corresponding to the resonator end face of semiconductor laser element 210 so that cracks formed at the time of cleavage are along groove portion 233, deviation of cleavage position is suppressed. Thereby, the cleavage yield can be improved.

Embodiment 2

A semiconductor laser element according to Embodiment 2 will be described. The semiconductor laser element according to the present embodiment is different from semiconductor laser element 10 according to Embodiment 1 in that no dividing groove is formed, and is identical in other points. Hereinafter, the semiconductor laser element according to the present embodiment will be described.

[2-1. Structure]

Figure 7:
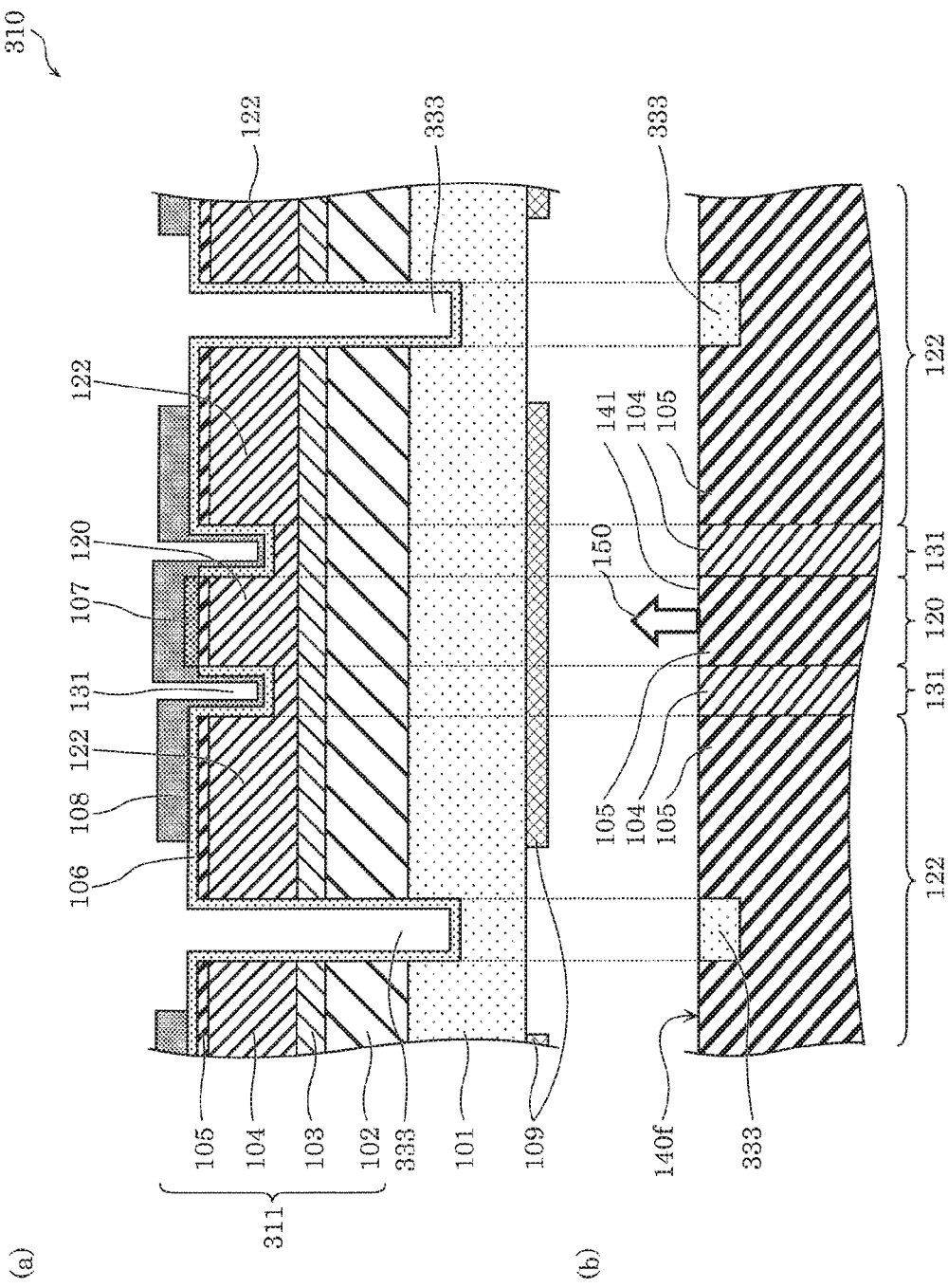
FIG. 7 is a schematic cross-sectional view and plan view showing a structure of a semiconductor laser element according to Embodiment 2.

The structure of the semiconductor laser element according to the present embodiment will be described with reference to the drawings. FIG. 7 is a schematic cross-sectional view and plan view showing the structure of semiconductor laser element 310 according to the present embodiment. The cross-sectional view (a) of FIG. 7 shows a cross-section similar to that of the cross-sectional view (a) of FIG. 2. The plan view (b) of FIG. 7 is a plan view in the vicinity of front-side resonator end face 140f of semiconductor laser element 310. In the plan view (b) of FIG. 7, insulating layer 106, p-electrode 107, and pad electrode 108 are removed in order to show the structure of the semiconductor layer of semiconductor laser element 310.

As shown in FIG. 7, semiconductor laser element 310 includes substrate 101, and laser array portion 311 that has a plurality of light emitting portions 141 arranged side by side, and is stacked above substrate 101. Semiconductor laser element 310 further includes n-electrode 109 disposed on the lower surface of substrate 101 as shown in the cross-sectional view (a) of FIG. 7.

The stacked body of substrate 101 and laser array portion 311 includes a pair of resonator end faces on opposite faces. The pair of resonator end faces is front-side and rear-side resonator mirrors of semiconductor laser element 310, respectively. The plurality of light emitting portions 141 are provided on front-side resonator end face 140f.

Laser array portion 311 includes a first conductive type first semiconductor layer, active layer 103, and a second conductive type second semiconductor layer in stated order from the substrate 101 side. Laser array portion 311 further includes insulating layer 106, p-electrode 107, and pad electrode 108. The first semiconductor layer includes n-side cladding layer 102. The second semiconductor layer includes p-side cladding layer 104 and p-side contact layer 105.

Note that, in semiconductor laser element 310 according to the present embodiment, an AlGaInP-based material is used similarly to semiconductor laser element 10 according to Embodiment 1. However, the material used for the semiconductor laser element according to the present embodiment is not limited thereto, and may be GaN, GaAs or the like.

Also in the present embodiment, the second semiconductor layer includes a plurality of ridge stripe portions 120 that serve as current paths and support portions 122 that are disposed on both sides of ridge stripe portions 120 and do not serve as current paths similarly to semiconductor laser element 10 according to Embodiment 1. The second semiconductor layer further includes separation grooves 131 that separate ridge stripe portions 120 and support portions 122.

Thereby, it is possible to reduce the stress caused by the concentration of the load on ridge stripe portions 120 when semiconductor laser element 310 is subjected to the junction down mounting.

Furthermore, as shown in FIG. 7, groove portion 333 is formed, but the dividing groove is not formed in semiconductor laser element 310 according to the present embodiment. That is, in the present embodiment, groove portion 333 is formed in support portion 122. In the present embodiment, groove portion 333 reaches a middle of substrate 101 from the upper surface of laser array portion 311. The depth of groove 333 in substrate 101 is similar to that of groove 133 of semiconductor laser element 10 according to Embodiment 1.

[2-2. Operation and Effect]

The operation and effect of semiconductor laser element 310 according to the present embodiment will be described. Groove portion 333 of semiconductor laser element 310 according to the present embodiment has the effect similar to that of groove portion 133 of the semiconductor laser element according to Embodiment 1. That is, the distortion of substrate 101 is divided by groove portion 333. For this reason, distortion generated in substrate 101 can be reduced. Therefore, it is possible to reduce warpage in the arrangement direction of the plurality of light emitting portions 141 of substrate 101. Thereby, when the laser beams emitted from the plurality of light emitting portions 141 are concentrated with a lens etc., the reduction of coupling efficiency due to the warpage of substrate 101 can be suppressed.

In addition, since groove portion 333 is disposed on at least one of the pair of resonator end faces, it becomes possible to reduce lattice mismatch distortion caused by the lattice constant difference between the first semiconductor layer and substrate 101, and thermal distortion caused by the difference in the thermal expansion coefficient. For this reason, it becomes possible to relieve the distortion in active layer 103, improve the polarization characteristics of semiconductor laser element 310, and realize semiconductor laser element 310 having a good polarization ratio in which the TE mode is dominant.

In addition, groove portion 333 reaches a middle of substrate 101 from the upper surface of laser array portion 311 in the present embodiment. That is, groove portion 333 is formed directly from the upper surface of laser array portion 311 without forming the dividing groove. For this reason, the manufacturing process of semiconductor laser element 310 can be simplified.

[2-3. Manufacturing Method]

A method for manufacturing semiconductor laser element 310 according to the present embodiment will be described. Since no dividing groove is formed in the present embodiment, groove portion 333 that reaches a middle of substrate 101 from the upper surface of the second semiconductor layer, that is, the upper surface of p-side contact layer 105 is formed by a wet etching method, a dry etching method or the like. Other manufacturing steps are similar to those of the method for manufacturing semiconductor laser element 10 according to Embodiment 1.

Semiconductor laser element 310 according to the present embodiment can be manufactured by such a manufacturing method.

Embodiment 3

A semiconductor laser element according to Embodiment 3 will be described. The semiconductor laser element according to the present embodiment is different from semiconductor laser element 210 according: to the variation of Embodiment 1 in that the groove portion is formed from the lower surface side of the substrate, and is identical in other points. Hereinafter, the semiconductor laser element according to the present embodiment will be described focusing on differences from semiconductor laser element 210 according to the variation of Embodiment 1.

[3-1. Structure]

Figure 8:
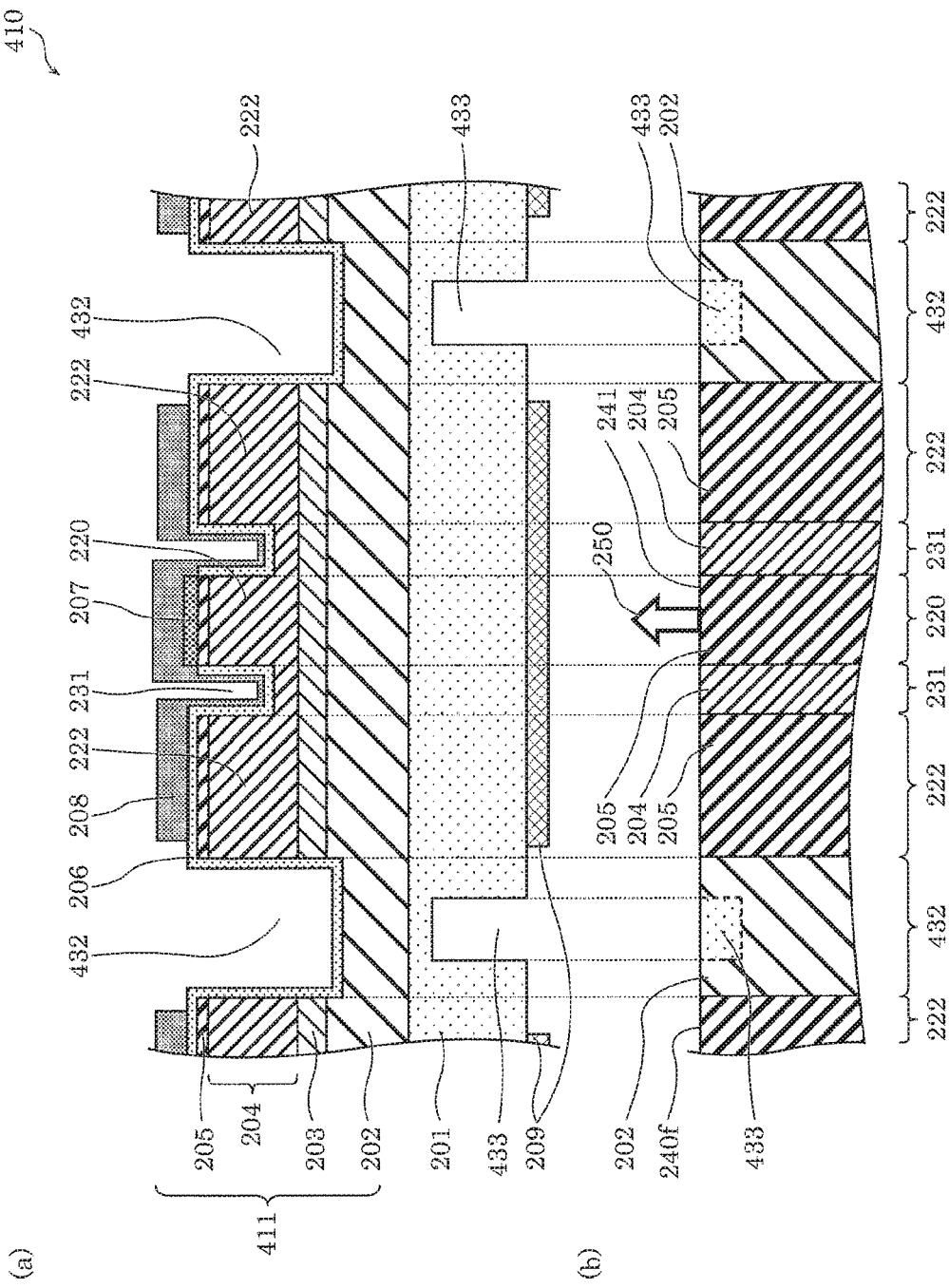
FIG. 8 is a schematic cross-sectional view and plan view showing a structure of a semiconductor laser element according to Embodiment 3.

The structure of the semiconductor laser element according to the present embodiment will be described with reference to the drawings. FIG. 8 is a schematic cross-sectional view and plan view showing the structure of semiconductor laser element 410 according to the present embodiment. The cross-sectional view (a) of FIG. 8 shows a cross-section similar to that of the cross-sectional view (a) of FIG. 2 of semiconductor laser element 410. The plan view (b) of FIG. 8 is a plan view in the vicinity of front-side resonator end face 240f of semiconductor laser element 410. In the plan view (b) of FIG. 8, insulating layer 206, p-electrode 207 and pad electrode 208 are removed in order to show the structure of the semiconductor layer of semiconductor laser element 410.

As shown in FIG. 8, semiconductor laser element 410 includes substrate 201, and laser array portion 411 that has a plurality of light emitting portions 241 arranged side by side, and is stacked above substrate 201. Semiconductor laser element 410 further includes n-electrode 209 disposed on the lower surface of substrate 201 as shown in the sectional view (a) of FIG. 8.

The stacked body of substrate 201 and laser array portion 411 includes a pair of resonator end faces on opposite faces. The pair of resonator end faces is front-side and rear-side resonator mirrors of semiconductor laser element 410, respectively. The plurality of light emitting portions 241 are provided on the front-side resonator end face 240f.

Laser array portion 411 includes a first semiconductor layer of a first conductivity type, active layer 203, and a second semiconductor layer of a second conductivity type in stated order from the substrate 201 side. Laser array portion 411 further includes insulating layer 206, p-electrode 207, and pad electrode 208. The first semiconductor layer includes n-side cladding layer 202. The second semiconductor layer includes p-side cladding layer 204 and p-side contact layer 205.

As shown in FIG. 8, in semiconductor laser element 410 according to the present embodiment, the second semiconductor layer includes a plurality of ridge stripe portions 220 that serve as current paths and support portions 222 that are disposed on both sides of ridge stripe portions 220 and do not serve as current paths. The second semiconductor layer further includes separation grooves 231 that separate ridge stripe portions 220 and support portions 222. By providing support portions 222 in this way, it is possible to reduce the stress caused by the load being concentrated on ridge stripe portions 220 when semiconductor laser element 410 is subjected to junction down mounting.

Furthermore, dividing groove 432 and groove portion 433 are formed in semiconductor laser element 410 according to the present embodiment. Dividing groove 432 is formed in support portion 222.

Groove portion 433 is formed from the lower surface side of substrate 201. That is, groove portion 433 that reaches a middle of substrate 201 from the lower surface of substrate 201 on at least one of the pair of resonator end faces is formed between two adjacent light emitting portions 241 among the plurality of light emitting portions 241.

Furthermore, in the present embodiment, laser array portion 411 includes dividing groove 432 that is continuous between a pair of resonator end faces between two adjacent light emitting portions 241 among the plurality of light emitting portions 241, and groove portion 433 is formed at a position facing dividing groove 432 in the lower surface of substrate 201.

[3-2. Operation and Effect]

The operation and effect of semiconductor laser element 410 according to the present embodiment will be described. Since groove portion 433 that reaches a middle of substrate 201 from the lower surface of substrate 201 is formed in semiconductor laser element 410 according to the present embodiment, the distortion of substrate 201 is divided. For this reason, distortion generated in substrate 201 can be reduced. Therefore, it is possible to reduce warpage in the arrangement direction of the plurality of light emitting portions 241 of substrate 201. Thereby, when the laser beams emitted from the plurality of light emitting portions 241 are concentrated with a lens etc., the reduction of coupling efficiency due to the warpage of substrate 201 can be suppressed.

Furthermore, groove portion 433 is formed at a position facing dividing groove 432 on the lower surface of substrate 201 in the present embodiment. In this way, groove portion 433 is formed at a position facing dividing groove 432, that is, at a position relatively distant from ridge stripe portions 220, so that the generation of cracks in ridge stripe portions 220 and the vicinity thereof can be reduced along with the formation of groove portions 433.

In the present embodiment, the depth of the portion of substrate 201 in groove portion 433 is 70 μm, but the depth is not limited thereto. The depth may be 2.0 μm or more. Thereby, the effect described above can be obtained reliably: The depth may be 30 μm or more. Thereby, the effect described above can be obtained still more reliably. Groove portion 433 may reach n-side cladding layer 202. Furthermore, the depth may be smaller than the thickness of substrate 201 by 20 μm or more. Since the thickness of substrate 201 is usually 50 μm or more and 120 μm or less, the depth may be 100 μm or less. Thereby, the strength of substrate 201 can be secured.

Furthermore, the length of groove portion 433 in the resonance direction is 5 μm in the present embodiment, but the length is not limited thereto. The length may be 1 μm or more. Thereby, the effect described above can be obtained reliably. Furthermore, the length may be less than half of the resonator length. That is, groove portion 433 may not be continuous between the pair of resonator end faces. Thereby, the strength of substrate 201 can be secured. Furthermore, the length may be 30 μm or less. Thereby, the strength of substrate 201 can be ensured still more reliably.

In the present embodiment, the width of groove portion 433 is 10 μm, but the width is not limited thereto. The width may be 1 μm or more. Thereby, the effect described above can be obtained reliably. In addition, the width may be 30 μm or less. Thereby, the strength of substrate 201 can be secured.

Furthermore, in general, when a GaN single crystal substrate is used like semiconductor laser element 410 according to the present embodiment, cleavage is difficult. However, in the present embodiment, since groove portion 433 that reaches a middle of substrate 201 is formed at a position corresponding to the resonator end face of semiconductor laser element 410 so that cracks formed at the time of cleavage are along groove portion 433, deviation of the cleavage position is suppressed. Thereby, the cleavage yield can be improved.

In addition, semiconductor laser element 410 according to the present embodiment can suppress thermal interference among the plurality of ridge stripe portions 220 by providing dividing groove 432 between the adjacent light emitting portions 241. In the present embodiment, dividing groove 432 reaches a middle of the first semiconductor layer from the upper surface of laser array portion 411 beyond the second semiconductor layer and active layer 203. Thereby, active layer 203 that can reach the highest temperature can be separated for each ridge stripe portion 220, so that thermal interference among the plurality of ridge stripe portions 220 can be further suppressed. Thereby, the diffusion of heat from each ridge stripe portion 220 toward substrate 201 can be promoted, so that the output of semiconductor laser element 410 can be increased.

[3-3. Manufacturing Method]

Figure 9A:
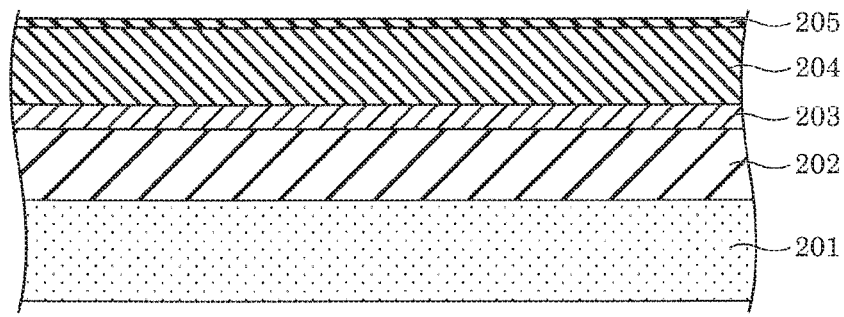
FIG. 9A is a schematic cross-sectional view showing a first step of the method of manufacturing the semiconductor laser element according to Embodiment 3.

A method for manufacturing semiconductor laser element 410 according to the present embodiment will be described with reference to the drawings. FIGS. 9A to 9H are schematic cross-sectional views showing the respective steps of the method for manufacturing semiconductor laser element 410 according to the present embodiment. In FIGS. 9A to 9H, a cross-section of semiconductor laser element 410 similar to that of FIG. 2 is shown. FIG. 9I is a schematic plan view showing a cleavage step of the method for manufacturing semiconductor laser element 410 according to the present embodiment. In FIG. 9I, insulating layer 206, p-electrode 207 and pad electrode 208 are removed in order to show the structure of the semiconductor layer of semiconductor laser element 410.

As shown in FIG. 9A, first, substrate 201 is prepared, and a first semiconductor layer, active layer 203 and a second semiconductor layer are stacked in stated order. In the present embodiment, n-side cladding layer 202, active layer 203, p-side cladding layer 204 and p-side contact layer 205 are stacked on substrate 201 in stated order. In the present embodiment, each layer is deposited by metal organic chemical vapor deposition (MOCVD).

Figure 9B:
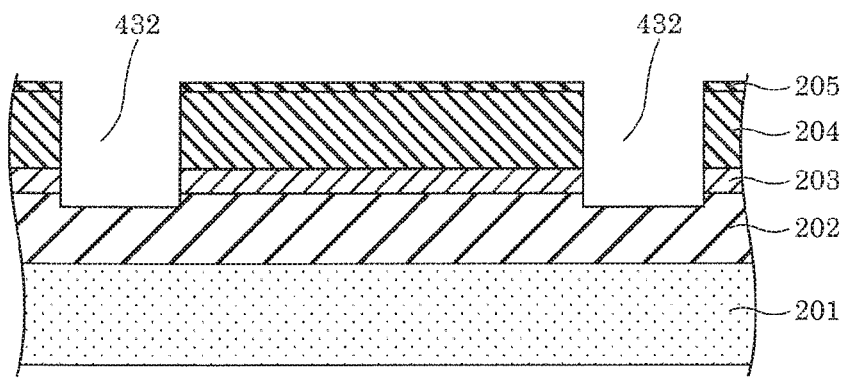
FIG. 9B is a schematic cross-sectional view showing a second step of the method of manufacturing the semiconductor laser element according to Embodiment 3.

Next, as shown in FIG. 9B, dividing groove 432 is formed. Specifically, first, dividing groove 432 is formed at a position substantially corresponding to the middle of adjacent light emitting portions 241 by ICP (Inductively Coupled Plasma) type reactive ion etching or the like. Dividing groove 432 is formed continuously, that is, without interruption, along the resonance direction of semiconductor laser element 410.

Figure 9C:
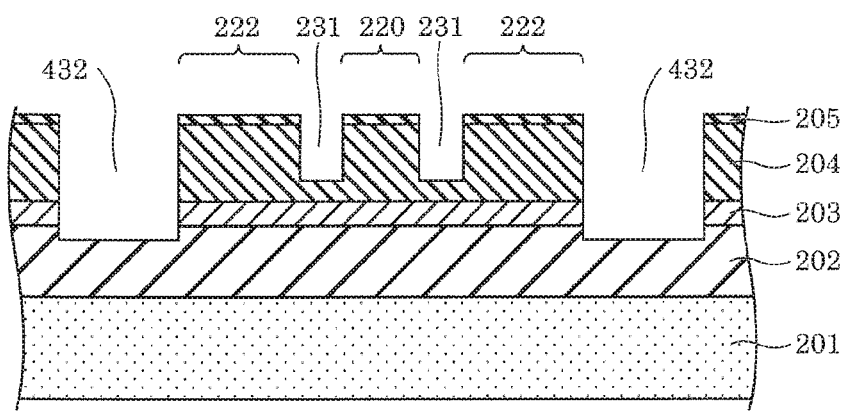
FIG. 9C is a schematic cross-sectional view showing a third step of the method of manufacturing the semiconductor laser element according to Embodiment 3.

Next, as shown in FIG. 9C, separation grooves 231 are formed by ICP type reactive ion etching or the like. Two separation grooves 231 are formed between each adjacent pair of dividing grooves 432. The portion between two separation grooves 231 of the second semiconductor layer (p-side cladding layer 204 and p-side contact, layer 205 in the present embodiment) becomes ridge stripe portion 220, and the portion between separation groove 231 and dividing groove 432 becomes support portion 222.

Figure 9D:
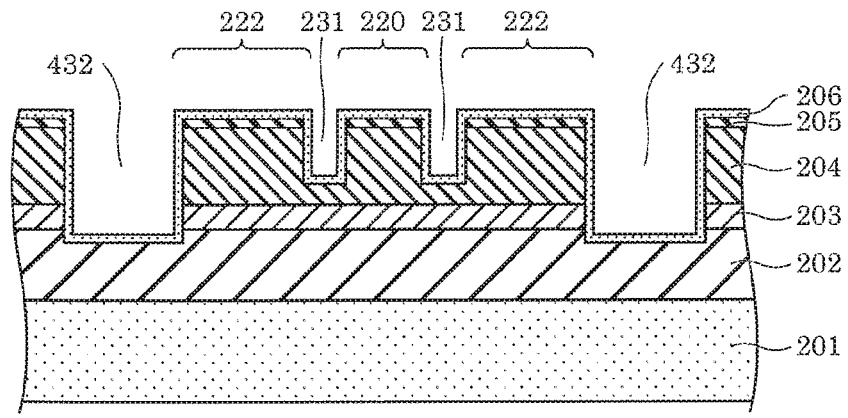
FIG. 9D is a schematic cross-sectional view showing a fourth step of the method of manufacturing the semiconductor laser element according to Embodiment 3.

Next, as shown in FIG. 9D, insulating layer 206 is formed by a plasma CVD method or the like. Insulating layer 206 is formed on the entire surface above substrate 201, that is, on the second semiconductor layer, separation groove 231 and dividing groove 432.

Figure 9E:
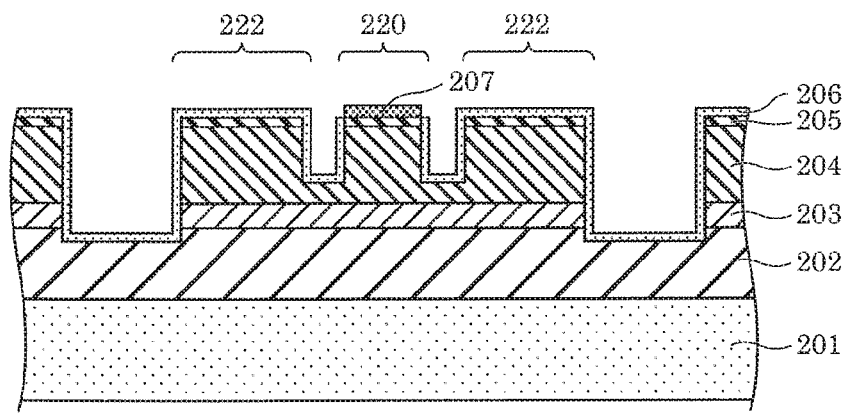
FIG. 9E is a schematic cross-sectional view showing a fifth step of the method of manufacturing the semiconductor laser element according to Embodiment 3.

Next, as shown in FIG. 9E, an opening is formed in insulating layer 206, and p-electrode 207 is formed in the opening. First, an opening is formed by removing a portion of insulating layer 206 above ridge stripe portion 220 by a wet etching method or the like. As a result, p-side contact layer 205 is exposed in the opening. Subsequently, p-electrode 207 is formed on p-side contact layer 205 in the opening by vacuum deposition or the like. Note that p-electrode 207 may also be formed above insulating layer 206.

Figure 9F:
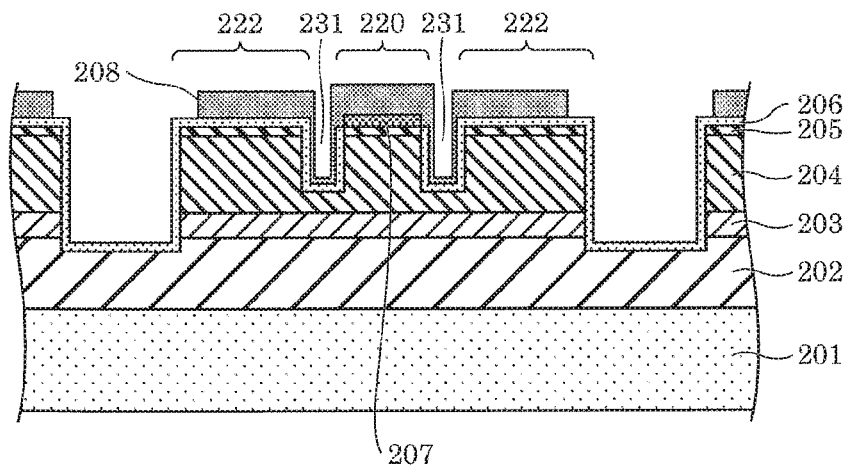
FIG. 9F is a schematic cross-sectional view showing a sixth step of the method of manufacturing the semiconductor laser element according to Embodiment 3.

Next, as shown in FIG. 9F, pad electrode 208 is formed above the second semiconductor layer by vacuum deposition or the like. In the present embodiment, pad electrode 208 is formed on ridge stripe portion 220 so as to cover p-electrode 207. Note that pad electrode 208 may also be formed above separation groove 231 and support portion 222 as shown in FIG. 9F.

Figure 9G:
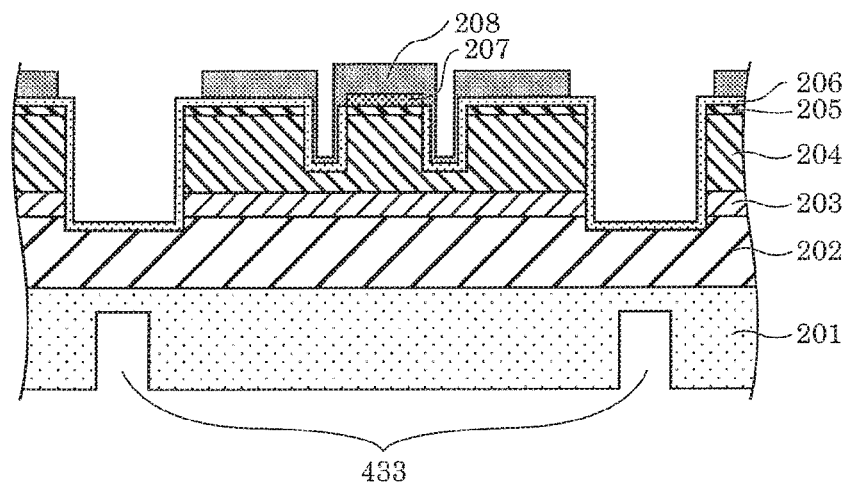
FIG. 9G is a schematic cross-sectional view showing a seventh step of the method of manufacturing the semiconductor laser element according to Embodiment 3.

Next, as shown in FIG. 9G, groove portion 433 is formed on the lower surface of substrate 201 by ICP-type reactive ion etching or the like. Groove portion 433 is formed at a position corresponding to the resonator end face of semiconductor laser element 410.

Figure 9H:
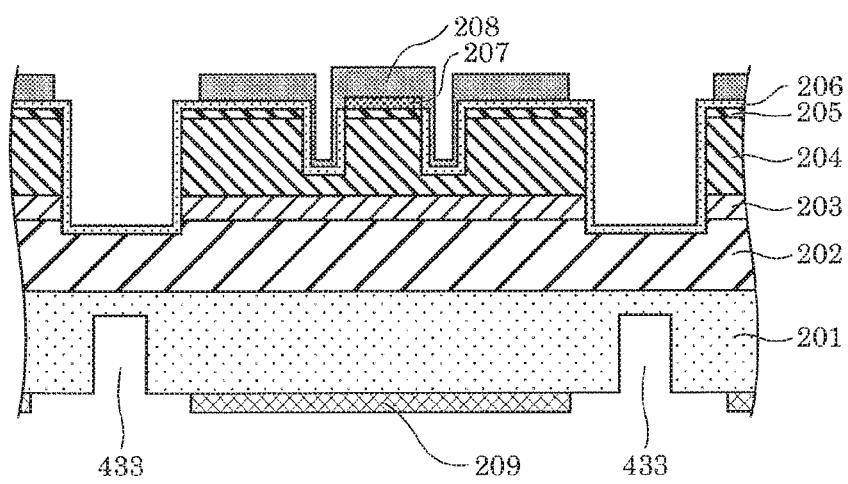
FIG. 9H is a schematic cross-sectional view showing an eighth step of the method of manufacturing the semiconductor laser element according to Embodiment b 3.

Next, as shown in FIG. 9H, n-electrode 209 is formed on the lower surface of substrate 201 by vacuum deposition or the like. N-electrode 209 is formed at a position corresponding to the back side of ridge stripe portion 220 on the lower surface of substrate 201.

Next, as shown in FIG. 9I, resonator end faces are formed by cleavage. Specifically, a scratch serving as a cleavage starting point is formed at a position corresponding to resonator end faces 240f and 240r of substrate 201, and substrate 201 is cleaved while applying the blade tip to the scratch. In FIG. 9I, the distance between resonator end faces 240f and 240r, that is, resonator length L is shown. Note that a reflective film such as a dielectric multilayer film may be formed on resonator end faces 240f and 240r.

Semiconductor laser element 410 according to the present embodiment can be manufactured through the steps as described above. Note that in the above manufacturing method, groove portion 433 is formed before n-electrode 209 is formed, but groove portion 433 may be formed after n-electrode 209 is formed using a laser scribing device or the like.

[3-4. Variation]

A semiconductor laser element according to a variation of the present embodiment will be described. In the above, an element that emits blue laser beam 250 using a GaN-based material is shown as semiconductor laser element 410, but the material used for the semiconductor laser element according to the present embodiment is not limited thereto. For example, a GaN-based material that emits a green laser beam, an AlGaInP-based material that emits a red laser beam, a GaAs-based material that emits an infrared laser beam or the like may be used. Hereinafter, a configuration using a GaN-based material as a semiconductor laser element according to a variation of the present embodiment will be described with reference to the drawings with a focus on differences from semiconductor laser element 410 described above.

The semiconductor laser element according to the present variation is different from semiconductor laser element 410 mainly in the configuration of the active layer. The active layer of the semiconductor laser element according to the present variation is a quantum well active layer in which 5 nm thick well layers made of $In_{0.3}Ga_{0.7}N$ and 10 nm thick barrier layers made of GaN are alternately stacked, and has two well layers. By providing such an active layer, the semiconductor laser element according to the present variation can emit a green laser beam having a wavelength of about 520 nm. The configuration of the active layer according to the present variation is not limited thereto, and it is only needed to be a quantum well active layer in which well layers made of $In_xGa_{1-x}N$ ($0<x<1$) and barrier layers made of $Al_xIn_yGa_{1-x-y}N$ ($0 \le x+y \le 1$) are alternately stacked.

Also in the semiconductor laser element according to the present variation having such an active layer, the effect similar to semiconductor laser element 410 described above is obtained.

Embodiment 4

A projector according to Embodiment 4 will be described. The projector according to the present embodiment includes the semiconductor laser elements according to the first to third embodiments and their variations. The projector according to the present embodiment will be described below with reference to the drawings.

Figure 10:
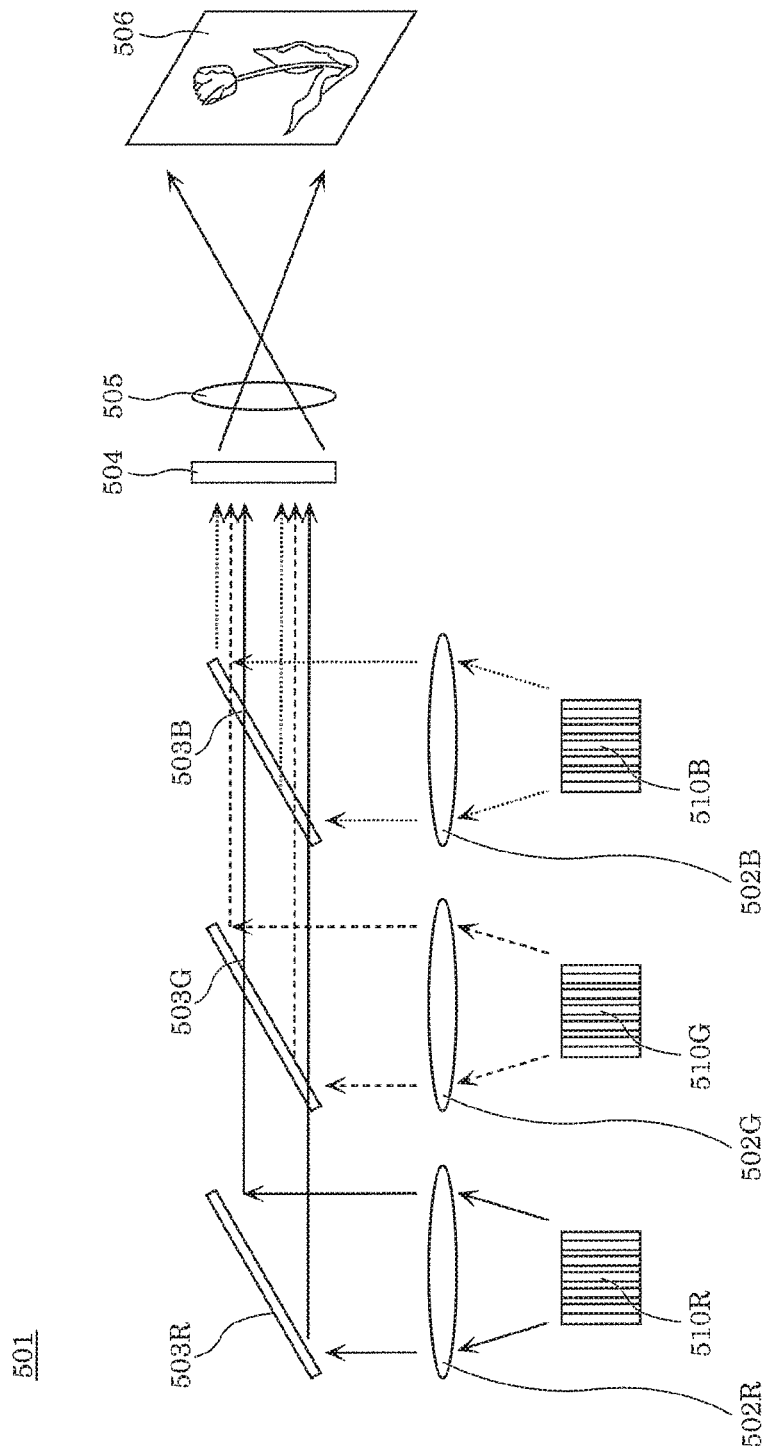
FIG. 10 is a schematic diagram of a projector according to Embodiment 4.
Figure 11:
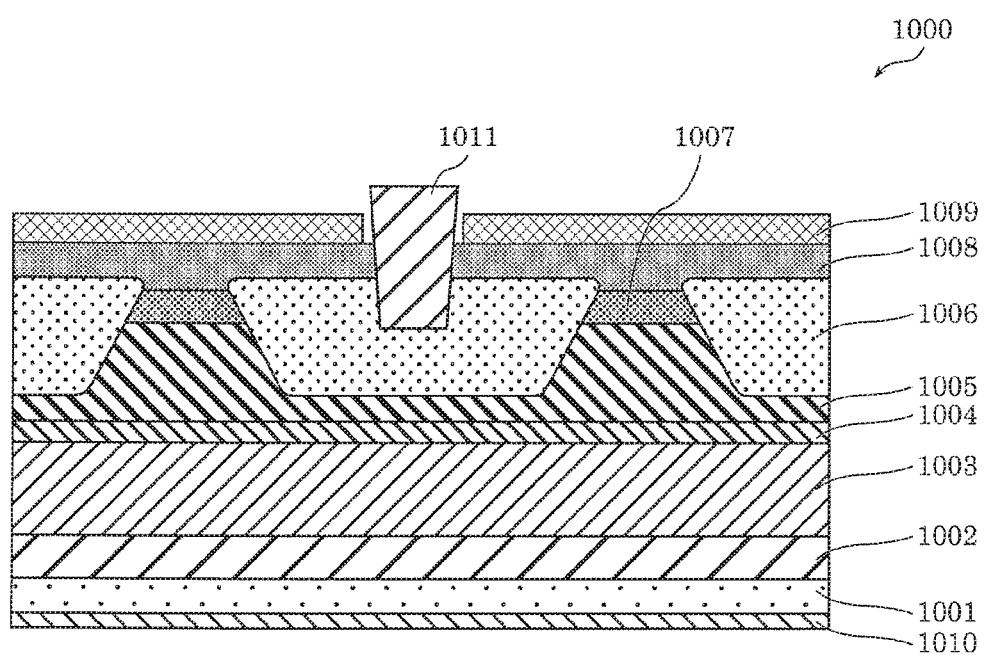
FIG. 11 is a cross-sectional view showing a configuration of a semiconductor laser element disclosed in PTL 1.

FIG. 10 is a schematic diagram of projector 501 according to the present embodiment. As shown in FIG. 10, projector 501 is an example of an image display device using a semiconductor laser element. In projector 501 in the present embodiment, for example, semiconductor laser element 510R that emits a red laser beam, semiconductor laser element 510G that emits a green laser beam and semiconductor laser element 510B that emits a blue laser beam are used as light sources. For example, semiconductor laser element 10 according to Embodiment 1 described above, the semiconductor laser element according to the variation of Embodiment 3 described above and semiconductor laser element 410 according to Embodiment 3 described above are used as semiconductor laser elements 510R, 51.0G and 510B, respectively.

Projector 501 includes lenses 502R, 502G and 502B, mirror 503R, dichroic mirror 503G and dichroic mirror 503B, spatial modulation element 504 and projection lens 505.

Lenses 5021, 502G and 502B are, for example, collimating lenses, and are disposed in front of semiconductor laser elements 510R, 510G and 510B, respectively.

Mirror 503R reflects the red laser beam emitted from semiconductor laser element 510R. Dichroic mirror 503E reflects the green laser beam emitted from semiconductor laser element 510E and transmits the red laser beam emitted from semiconductor laser element 510R. Dichroic mirror 503B reflects the blue laser beam emitted from semiconductor laser element 510B, transmits the red laser beam emitted from semiconductor laser element 510R, and transmits the green laser beam emitted from semiconductor laser element 510G.

Spatial modulation element 504 forms a red image, a green image, and a blue image using a red laser beam from semiconductor laser element 510R, a green laser beam from semiconductor laser element 510G and a blue laser beam from semiconductor laser element 510B in accordance with an input image signal input to projector 501. For example, a liquid crystal panel or a DMD (digital mirror device) using a MEMS (micro electric mechanical system) can be used as spatial modulation element 504.

Projection lens 505 projects an image formed by spatial modulation element 504 onto screen 506.

In projector 501 configured in this way, the laser beams emitted from semiconductor laser elements 510R, 510G and 510E are made substantially parallel beams by lenses 502R, 502G and 502B, respectively, and subsequently, they are incident on mirror 503R, dichroic mirror 503G and dichroic mirror 503B.

Mirror 503R reflects the red laser beam emitted from semiconductor laser element 510R in the 45° direction. Dichroic mirror 503G transmits the red laser beam from semiconductor laser element 510R reflected by mirror 503R and reflects the green laser beam emitted from semiconductor laser element 510E in the 45° direction. Dichroic mirror 503B transmits the red laser beam from semiconductor laser element 510R reflected by mirror 503R and the green laser beam from semiconductor laser element 510G reflected by dichroic mirror 503G and reflects the blue laser beam emitted from semiconductor laser element 510E in the 45° direction.

The red, green and blue laser beams reflected by mirror 503R, dichroic mirror 503G and dichroic mirror 503B are incident on spatial modulation element 504 in a time division manner (for example, red, green and blue are sequentially switched at a period of 120 Hz). In this case, spatial modulation element 504 displays an image for red when a red laser beam is incident, displays an image for green when a green laser beam is incident, and displays an image for blue when a blue laser beam is incident.

In this way, the red, green and blue laser beams spatially modulated by spatial modulation element 504 are projected onto screen 506 through projection lens 505 as a red image, a green image and a blue image. In this case, since each of the red image, the green image and the blue image projected onto screen 506 in a time division manner is a single color, but switches at high speed, it is recognized as an image of colors in which these images are mixed, that, is, as a color image.

As described above, since projector 501 in the present embodiment uses semiconductor laser elements according to the embodiment described above and their variations as semiconductor laser elements 510R, 510G and 510B, the coupling efficiency of laser beams emitted from a plurality of light emitting portions is high. For this reason, projector 501 with high brightness and high definition can be realized. (Variations, etc.)

As described above, the semiconductor laser element according to the present disclosure has been described based on each embodiment, but the present disclosure is not limited to each embodiment described above.

For example, current confinement is realized using a ridge structure in the semiconductor laser element according to each of the above embodiments and variations thereof, but means for realizing current confinement is not limited thereto, and an electrode stripe structure, an embedded structure or the like may be used.

Furthermore, in the semiconductor laser elements according to Embodiments 1, 3 and their variations, the dividing groove is continuously formed along the resonance direction, but it may be discontinuous. That is, the dividing groove may be interrupted along the resonance direction.

In addition, forms obtained by subjecting various variations conceived by those skilled in the art to each of the above embodiments and forms realized by arbitrarily combining the components and functions in each of the above embodiments within the scope of not departing from the spirit of the present disclosure are also included in the present disclosure.

INDUSTRIAL APPLICABILITY

The semiconductor laser element of the present disclosure can be applied to, for example, a semiconductor laser element that emits light in visible range from blue purple to red for projectors.

The invention claimed is:

1. A semiconductor laser element, comprising:
a substrate; and
a laser array portion that includes a plurality of light emitting portions arranged side by side, and is stacked above the substrate, wherein
a stacked body of the substrate and the laser array portion includes a pair of resonator end faces on opposite faces,
a groove portion that extends from the laser array portion into the substrate is provided on at least one of the pair of resonator end faces between two adjacent light emitting portions among the plurality of light emitting portions,
the groove portion is not continuous between the pair of resonator end faces,
the laser array portion includes a dividing groove that is continuous between the pair of resonator end faces between the two adjacent light emitting portions among the plurality of light emitting portions,
the groove portion is provided on a bottom surface of the dividing groove, and
a side wall of the groove portion is disposed inside the dividing groove relative to a side wall of the dividing groove.

2. The semiconductor laser element according to claim 1, wherein
the laser array portion includes a first semiconductor layer of a first conductivity type, an active layer, and a second semiconductor layer of a second conductivity type in stated order from the substrate side,
the second semiconductor layer includes a plurality of ridge stripe portions that serve as current paths, support portions that are disposed on both sides of the ridge stripe portions and do not serve as current paths, and separation grooves that separate the ridge stripe portions and the support portions, and
the dividing groove is provided in the support portions.

3. The semiconductor laser element according to claim 2, wherein the groove portion reaches a middle of the substrate from an upper surface of the laser array portion.

4. The semiconductor laser element according to claim 1, wherein a depth of a portion of the substrate of the groove portion is 2.0 μm or more.

5. The semiconductor laser element according to claim 1, further comprising an insulating layer, wherein the insulating layer directly contacts the substrate.

6. The semiconductor laser element according to claim 1, further comprising an insulating layer, wherein the insulating layer directly contacts the laser array portion.

7. A semiconductor laser element, comprising:
a substrate; and
a laser array portion that includes a plurality of light emitting portions arranged side by side, and is stacked above the substrate, wherein
a stacked body of the substrate and the laser array portion includes a pair of resonator end faces on opposite faces,
a groove portion that extends from the laser array portion into the substrate is provided on at least one of the pair of resonator end faces between two adjacent light emitting portions among the plurality of light emitting portions,
the groove portion is not continuous between the pair of resonator end faces,
the groove portion reaches a middle of the substrate from an upper surface of the laser array portion,
the laser array portion includes a first semiconductor layer of a first conductivity type, an active layer, and a second semiconductor layer of a second conductivity type in stated order from the substrate side, the second semiconductor layer includes a plurality of ridge stripe portions that serve as current paths, support portions that are disposed on both sides of the ridge stripe portions and do not serve as current paths, and separation grooves that separate the ridge stripe portions and the support portions, and the groove portion is provided in the support portions.

8. The semiconductor laser element according to claim 7, the groove portion reaches the middle of the substrate from a lower surface of the substrate on at least one of the pair of resonator end faces between two adjacent light emitting portions among the plurality of light emitting portions.

9. The semiconductor laser element according to claim 8, wherein a dividing groove is provided in the support portions.

10. The semiconductor laser element according to claim 8, wherein the laser array portion includes a dividing groove that is continuous between the pair of resonator end faces between the two adjacent light emitting portions among the plurality of light emitting portions, and the groove portion is provided at a position facing the dividing groove on the lower surface of the substrate.

* * * * *